United States Patent
Fujimaki

(10) Patent No.: US 6,780,725 B2
(45) Date of Patent: Aug. 24, 2004

(54) METHOD FOR FORMING A SEMICONDUCTOR DEVICE INCLUDING FORMING VERTICAL NPN AND PNP TRANSISTORS BY EXPOSING THE EPITAXIAL LAYER, FORMING A MONOCRYSTAL LAYER AND ADJUSTING THE IMPURITY CONCENTRATION IN THE EPITAXIAL LAYER

(75) Inventor: Hirokazu Fujimaki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/301,283

(22) Filed: Nov. 21, 2002

(65) Prior Publication Data

US 2003/0219952 A1 Nov. 27, 2003

(30) Foreign Application Priority Data

May 21, 2002 (JP) ........................................ 2002-145749

(51) Int. Cl.[7] .................... H01L 21/8222; H01L 21/331
(52) U.S. Cl. ...................... 438/313; 438/314; 438/320; 438/357; 438/361; 438/369
(58) Field of Search .............................. 438/313, 314, 438/320, 357, 361, 369

(56) References Cited

U.S. PATENT DOCUMENTS 5,599,723 A * 2/1997 Sato ........................... 438/320

2002/0142557 A1 * 10/2002 Hashimoto et al. ......... 438/309

FOREIGN PATENT DOCUMENTS

JP          8-31841         2/1996

* cited by examiner

Primary Examiner—W. David Coleman
Assistant Examiner—William M. Brewster
(74) Attorney, Agent, or Firm—Volentine Francos, PLLC

(57) ABSTRACT

A method of manufacturing vertical NPN and PNP transistors on a substrate includes forming a first oxide film, a P-polycrystal silicon film, and a second oxide film successively on N-silicon epitaxial film on the substrate. An opening is made in the first oxide film to expose the N-silicon epitaxial film and a bottom of the P-polycrystal silicon film anisotropically etching the second oxide film and the P-polycrystal silicon film, and then isotropically etching the exposed first oxide film. A part of the opening is plugged by growing a selective epitaxial layer including a P-monocrystal layer from the surface of the N-silicon epitaxial film, and growing a polycrystal layer from the bottom of the P-polycrystal silicon film. Then, within a PNP transistor section, position and impurity concentration of a P-N junction are adjusted by self-aligned implanting or diffusing of P-impurities into the N-silicon epitaxial layer through the opening.

11 Claims, 13 Drawing Sheets

B-B CROSS SECTION

C-C CROSS SECTION

PNP TRANSISTOR      NPN TRANSISTOR

S101a

S101b

S102a

S102b

S103a

S103b

S104a

S104b

S105a

S105b

S106a

S106b

S107a

S107b

S108a

S108b

S109a

S109b

S110a

S110b

PNP TRANSISTOR

NPN TRANSISTOR

S201a

S201b

S202a

S202b

S203a

S203b

PNPN THYRISTOR     NPN TRANSISTOR

S301a

S301b

S302a

S302b

S303a

S303b

PNP TRANSISTOR

S303c

PNP TRANSISTOR	NPN TRANSISTOR

S401a

S401b

S402a

S402b

PNP TRANSISTOR  NPN TRANSISTOR

S501a

S501b

S502a

S502b

S503a

S503b

FIELD OXIDE FILM

S504a

S504b

FIELD OXIDE FILM

S505a

S505b

S506a

S506b

S507a

S507b

S508a

S508b

S509a

S509b

S510a

S510b

S511a

S511b

S512a

S512b

METHOD FOR FORMING A SEMICONDUCTOR DEVICE INCLUDING FORMING VERTICAL NPN AND PNP TRANSISTORS BY EXPOSING THE EPITAXIAL LAYER, FORMING A MONOCRYSTAL LAYER AND ADJUSTING THE IMPURITY CONCENTRATION IN THE EPITAXIAL LAYER

FIELD OF THE INVENTION

The present invention relates to semiconductor devices and methods of manufacturing semiconductor devices, and more specifically relates to semiconductor devices in which NPN transistors and PNP transistors are formed on the same chip, to semiconductor devices in which such bipolar transistors and MOS transistors are formed on the same chip, and to methods for manufacturing such semiconductor devices.

BACKGROUND OF THE INVENTION

One of the advantages of a bipolar device (BJT) to a MOS device is in its high-speed operation. It results from the property of high-speed response and high current-driving power of the bipolar transistor. However, the bipolar device has the disadvantage that it is not suited to large-scale integration.

The MOS device enables substantial reduction of electric power consumption by use of the CMOS structure in which both of NMOS transistors and PMOS transistors are formed on one chip instead of the old structure in which only one of them is formed on one chip.

On the other hand, in the field of bipolar devices, there is a growing need of a high-speed PNP transistor that can operate at a speed close to the operation speed of the ultra high-speed NPN transistor typified by the SiGe:HBT (hetero bipolar transistor having a SiGe layer for its base). That is because, if a complimentary circuit comprised of the ultra high-speed NPN transistor and the high-speed PNP transistor is formed on the same chip as an elementary circuit, it becomes possible to reduce sharply a current of the bipolar device, keeping its high-speed performance and high driving power or even reinforcing them, whereby a power supply of the bipolar device can be downsized, and an operational amplifier having an increased operation speed and a reduced power consumption can be realized, for example.

In addition, as the CMOS device becomes faster, the need of a faster LDVS (Low Voltage Differential Signaling) circuit having PNP transistors constituting an interface between the CMOS device and the bipolar device is growing recently. Thus the necessity of increasing the operation speed of the PNP transistor is arising in this respect as well.

However, forming the PNP transistor and the ultra high-speed NPN transistor which is typically a SiGe:HBT in one chip requires a very complicated manufacturing process including a number of process steps. To reduce the number of process steps, the structure of the PNP transistor has to be extremely simplified and accordingly its performance is substantially lowered.

Moreover, even if the PNP transistor and the NPN transistor are formed on the same chip through long and elongated process to constitute the complementary circuit, both its cut-off frequency and maximum oscillation frequency are on the order of 20 GHz which are lower than one-fifth those of the NPN transistor of the SiGe:HBT type. Accordingly, even if the bipolar device of the complementary type is realized by forming the NPN transistor and the PNP transistor in one and the same chip, its operation speed is limited to that of the PNP transistor although the cut-off frequency $f_T$ and the maximum oscillation frequency $f_{max}$ of the NPN transistor thereof exceed 100 GHz.

Incidentally, a structure in which an NPN transistor and a PNP transistor are formed in the same substrate is known as disclosed, for example, in Japanese Patent Application No. 6-159732. In this structure, both of the NPN and PNP transistors are of the vertical type, and they take equal areas on the chip. This structure is symmetrical about conduction types (P-type and N-type) judging from the manufacturing process. Accordingly, the PNP transistor has operation speed, withstand voltage, and d.c. characteristics close to those of the NPN transistor, so this structure may be applicable to complementary circuits as well as power supplies. However, in this structure, since the base is formed by conventional ion implantation, even the NPN transistor will not have a maximum oscillation frequency over 50 GHz.

SUMMARY OF THE INVENTION

The present invention has been made in light of the foregoing problem with an object of manufacturing a semiconductor device in which the ultra high-speed NPN transistors and the high-speed PNP transistors are formed on the same chip without substantially increasing the number of process steps. Another object of the invention is to manufacture a semiconductor device in which high-speed PMOS transistors and NMOS transistors are formed in addition to the ultra high-speed NPN transistors and the high-speed PNP transistors in one and the same chip without substantially increasing the number of process steps.

The object of the invention is achieved also by a method of manufacturing a semiconductor device in which a vertical NPN transistor and a vertical PNP transistor are formed on the same substrate comprising:

a first step of forming a first oxide film, a P-polycrystal silicon film, and a second oxide film in succession on an N-silicon epitaxial film formed on a substrate;

a second step of making an opening in the first oxide film through which a surface of the N-silicon epitaxial film and a part of a bottom of the P-polycrystal silicon film are exposed by anaisotropically etching the second oxide film and the P-polycrystal silicon film, and then isotropically etching the first oxide film that has been exposed;

a third step of plugging at least a part of the opening by growing a selective epitaxial layer including a P-monocrystal layer from the surface of the N-silicon epitaxial film, and growing a polycrystal layer from the part of the bottom of the P-polycrystal silicon film; and a fourth step of adjusting, within a PNP transistor section, a P-N junction's position and impurity concentration by implanting or diffusing P-impurities into the N-silicon epitaxial layer in a self-aligning manner by use of the opening.

The object of the invention is also achieved by A method of manufacturing a semiconductor device in which a vertical NPN transistor and a vertical PNP transistor are formed on the same substrate comprising:

a first step of forming a P-epitaxial layer or a well layer for a PNP transistor section and forming an N-epitaxial layer or a well layer for a NPN transistor section on a substrate;

a second step of forming a first insulation film and a first polycrystal silicon in succession on the substrate on which the epitaxial layers or the well layers have been formed, separating the first polycrystal silicon layer into the PNP and NPN transistor sections by an exposure process and an etching process, and converting conduction type of the first polycrystal silicon layer into P-type for the NPN transistor section and into N-type for the PNP transistor section;

a third step of forming a second insulation film to cover an entire substrate surface and subsequently making an opening penetrating thorough the second insulation film and the first polycrystal silicon layer to expose the first insulation film in each of the NPN and PNP transistor sections;

a fourth step of etching isotropically first and then laterally the exposed first insulation film in the PNP transistor section with the NPN transistor section being protected by a resist pattern to expose a surface of the P-epitaxial layer or the well layer and a part of a bottom of the first polycrystal silicon layer, subsequently growing a selective epitaxial layer containing N-impurities within the opening, and thermally oxidizing a surface of the grown selective epitaxial layer; and a fifth step of etching isotropically first and then laterally the exposed first insulation film in the NPN transistor section with the PNP transistor section being protected by a resist pattern to expose a surface of the N-epitaxial layer or the well layer and a part of a bottom surface of the first polycrystal silicon layer, subsequently growing a selective epitaxial layer containing P-impurities within the opening, and thermally oxidizing a surface of the grown selective epitaxial layer.

Another object of the invention is achieved by method of manufacturing a semiconductor device in which a vertical PNP transistor, a vertical NPN transistor, a lateral PMOS transistor and a lateral NMOS transistor are formed on the same substrate comprising:

a first step of forming a P-epitaxial layer for each of a PNP transistor section and an NMOS transistor section, and forming an N-epitaxial layer for each of an NPN transistor section and a PMOS transistor section on a substrate;

a second step of forming a first insulation film and a first polycrystal silicon layer in succession on the substrate on which the P-and N-epitaxial layers have been formed, separating the first polycrystal silicon layer into the NPN, PNP, PMOS, and NMOS transistor sections by an exposure process and an etching process, and converting conduction type of the first polycrystal silicon layer into P-type for the NPN and PMOS transistor sections and into N-type for the PNP and NMOS transistor sections;

a third step of forming a second insulation film to cover an entire substrate surface, and subsequently making an opening penetrating thorough the second insulation film and the first polycrystal silicon layer to expose the first insulation film in each of the NPN, PNP, PMOS and NMOS transistor sections;

a fourth step of etching isotropically first and then laterally the exposed first insulation film in each of the PMOS and NMOS transistor sections with the PNP and NPN transistor sections being protected by a resist pattern to expose surfaces of the P- or N-epitaxial layer and a part of a bottom of the first polycrystal silicon layer, subsequently growing a SiGe epitaxial layer that is lattice-relaxed with the P- or N-epitaxial layer and growing a silicon epitaxial layer that is not lattice-relaxed with the SiGe epitaxial layer within the opening, and then thermally oxidize a surface of the grown silicon epitaxial layer;

a fifth step of etching isotropically first and then laterally the exposed first insulation film in the PNP transistor section with the NPN, PMOS and PMOS transistor sections being protected by a resist pattern to expose surfaces of the P-epitaxial layer and a part of a bottom of the first polycrystal silicon layer, subsequently growing a selective epitaxial layer containing N-impurities within the opening, and thermally oxidizing a surface of the grown selective epitaxial layer;

a sixth step of etching isotropically first and then laterally the exposed first insulation film in the NPN transistor section with the PNP, PMOS and NMOS transistor sections being protected by a resist pattern to expose surfaces of the N-epitaxial layer and a part of a bottom of the first polycrystal silicon layer, subsequently growing a selective epitaxial layer containing P-impurities within the opening, and thermally oxidizing a surface of the grown selective epitaxial layer;

a seventh step of forming a third insulation film and a second polycrystal silicon layer in succession to cover the entire substrate surface, subsequently etching back the polycrystal silicon layer so that the polycrystal silicon layer remains as a sidewall of each of the openings, etching the third insulation film and an insulation film having been formed within each of the openings by using the remaining polycrystal silicon layer as a mask to expose a surface of the epitaxial layer within each of the openings, thermally oxidizing the exposed surface of the epitaxial layer thereby forming a gate oxide film for each of the PMOS and NMOS transistors, and implanting impurities into the PMOS and NMOS transistor sections for adjusting threshold voltages by use of a resist mask; and an eighth step of removing the insulation films having been formed within the openings of the NPN and PNP transistor sections by use of a resist pattern, forming a third polycrystal silicon layer within each of the NPN, PNP, PMOS, and NMOS transistor sections, and converting conduction type of the third polycrystal silicon layer into N-type for the NPN and PMOS transistor sections and into P-type for the PNP and NMOS transistor sections.

BRIEF DESCRIPTION OF THE DRAWINGS

Embodiments of the invention will now be described by way of example and with reference to the accompanying drawings in which.

DESCRIPTION OF THE PREFERRED EMBODIMENTS

Figure 1A:
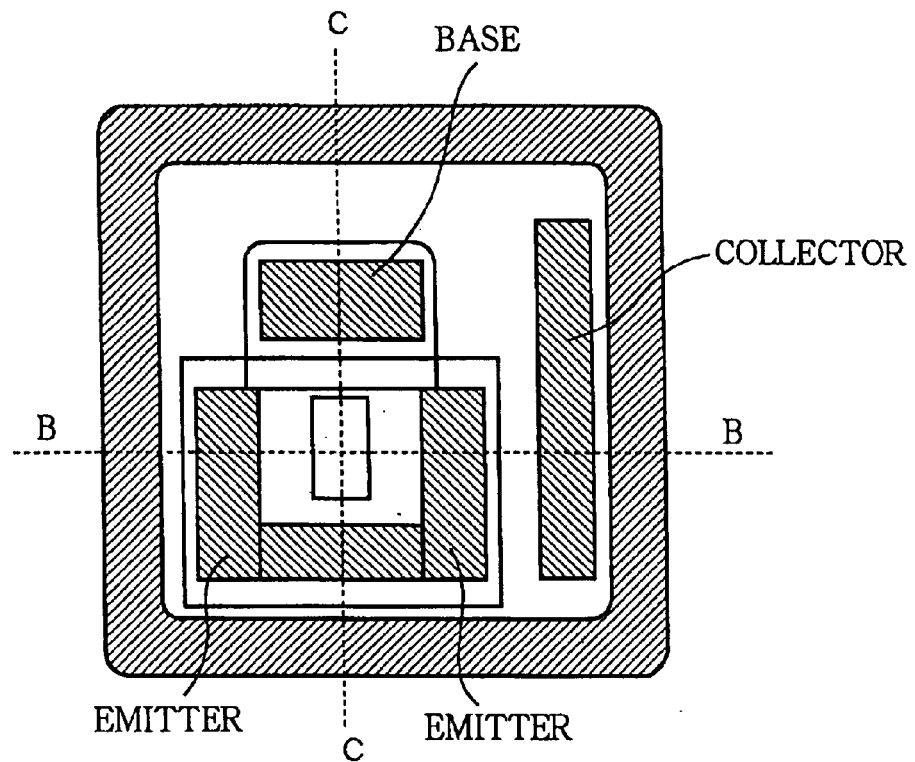
FIGS. 1A to 1D are diagrams showing a structure of a first semiconductor device according to the invention.
Figure 1B:
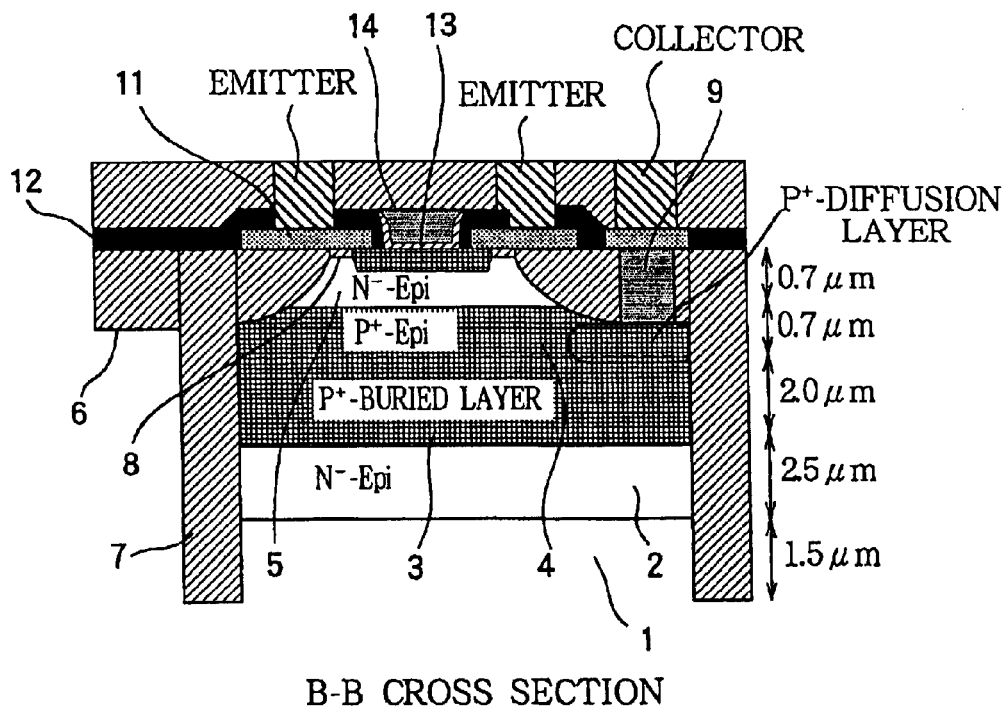
Figure 1C:
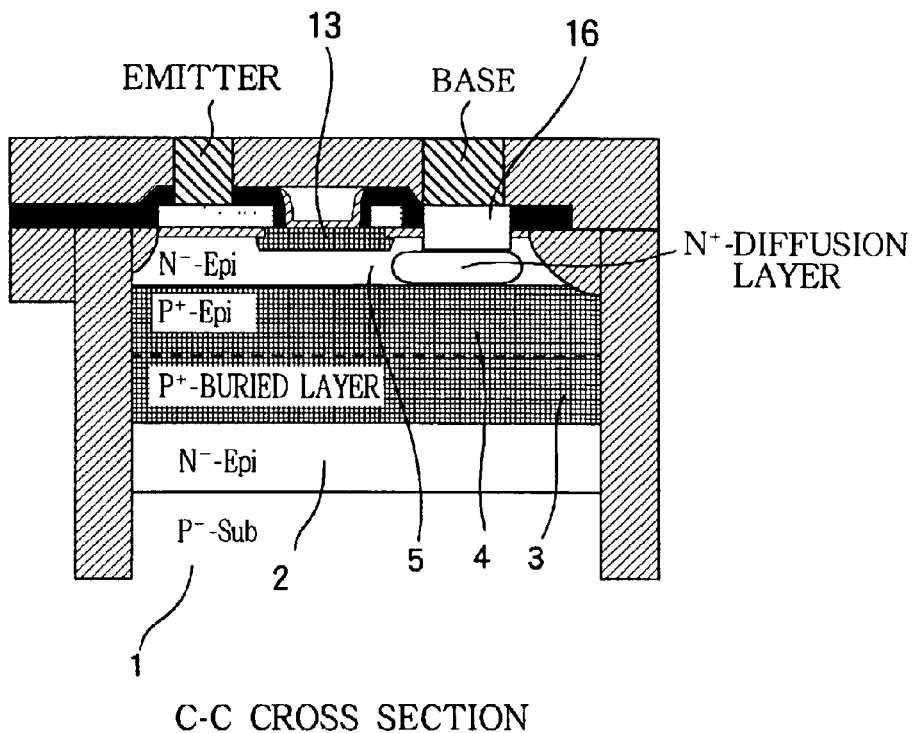
Figure 1D:
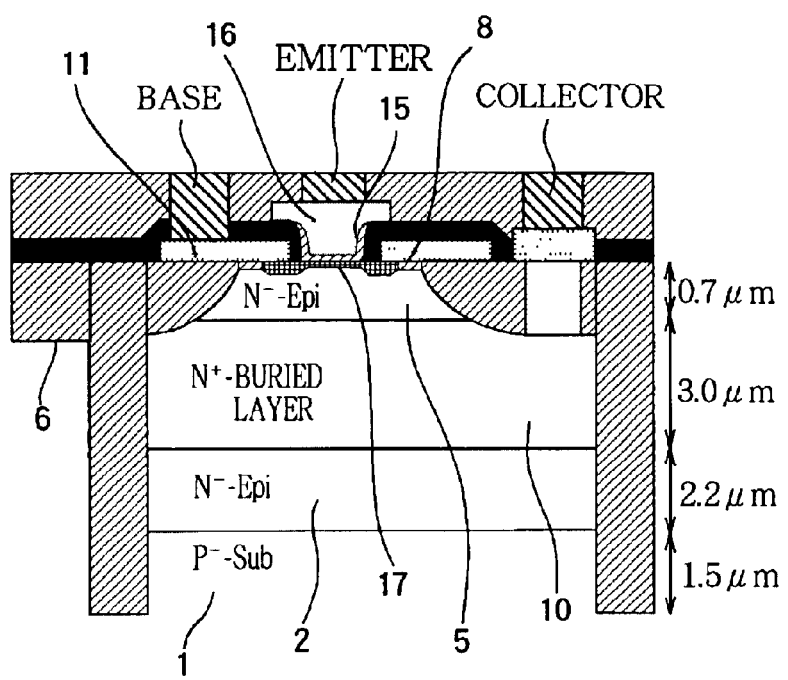

A first semiconductor device according to the invention is explained with reference to FIGS. 1A to 1D. FIG. 1A is a plan view of a PNP transistor, FIG. 1B is a B–B' cross section of the PNP transistor, FIG. 1C is a C–C' cross section of the PNP transistor, and FIG. 1D is a cross sectional view of an NPN transistor. These transistors are formed on the same wafer. The NPN transistor is a SiGe:C-HBT whose base is thinner than 30 nm, and the PNP transistor has a vertical structure. The transistors are separated by 7.5 μm-deep trenches 7 filled with an oxide film. A field oxide film 6 having a thickness of about 1 μm is embedded not only in the field region but also in the vicinity of each of the active regions surrounded by the trenches.

As shown in FIG. 1B, in the PNP transistor, a 2.5 μm-thick N-epitaxial region 2 is formed on a P-substrate 1. A P$^+$-layer 3, a P-epitaxial layer 4, and an N-epitaxial layer 5 are layered over the N-epitaxial region 2 in this order. In each of the PNP and NPN transistors, an intrinsic region is substantially defined by a monocrystal region surrounded by a thermally-oxidized film 8 extending from a bird's beak of the field oxide film 6. As shown in FIG. 1B and FIG. 1C, in the PNP transistor, the P-doped active emitter region 3 spreads not only to this monocrystal region but also to a part of the epitaxial layer 5.

The impurity concentration in this emitter region is on the order of $1 \times 10^{19}$ atoms/cc. This emitter region is electrically connected to a P$^+$-polycrystal silicon 11 at the thermally-oxidized film 8 having an opening formed in a self-aligning manner. A base region of the PNP transistor is constituted by the N-epitaxial layer 5, and the phosphorus concentration in this region is on the order of about $5 \times 10^{16}$ atoms/cc. As shown in FIG. 1C, the connection between this base region and an electrode is made by a region 16 which is formed by making, within the region surrounded by the trench, a hole in the thermally-oxidized film 8 at a portion distant enough from the end of field oxide film 6 (the bird's beak), and filling this hole with N$^+$-polycrystal silicon. An active collector region is comprised of the P-epitaxial layer 4 below which the P$^+$-layer 3 having low resistance lies. Similarly, the connection between this region and an electrode is made by a P$^+$-polycrystal region 9 having impurity concentration on the order of $2 \times 10^{19}$ atoms/cc which is formed by making a hole in the field oxide film having a thickness of about 1 μm in the vicinity of the trench.

Next, the structure of the NPN transistor is explained. As shown in FIG. 1D, in the NPN transistor, the N-epitaxial layer 2, an N$^+$-layer 10, and the N-epitaxial layer 5 which serves as the base of the PNP transistor are layered over the P-substrate 1 in this order. They constitute a buried collector and an active collector region. A monocrystal region surrounded by the thermally-oxidized film 8 includes a 50 nm-thick N-type monocrystal silicon bottom layer, a 10 nm-thick N-type Si—Ge—C middle layer, and a 30 nm-thick P-type Si—Ge—C top layer. Above them is an N-silicon layer serving as an active emitter region 17. The active emitter region 17 is electrically connected to the N$^+$-polycrystal silicon region 16 through an oxide film formed by CVD (referred to as CVD oxide film hereinafter) having an opening aligned with a center portion of these epitaxial layers.

The NPN transistor having the above-described structure has the following basic parameters.

The NPN transistor is a SiGe:C-HBT having a base thinner than 30 nm, and carrier base transit time τF shorter than 1.5 psec.

The current gain $h_{FE}$ is larger than 100.

The base resistance is smaller than 50 Ω when the emitter has a length of 5 μm and an effective width of 0.2 μm.

The collector-base junction capacitance $C_{jc}$ is smaller than 7 fF when the emitter has a length of 5 μm and an effective width of 0.2 μm.

The above basic parameters realize an ultra high-speed transistor whose cut-off frequency $f_T$ and maximum oscillation frequency $f_{max}$ exceed 100 GHz. As for the PNP transistor, it is possible that the carrier base transit time is shorter than 20 psec and the cut-off frequency $f_T$ exceeds 4 GHz since the base can be made thinner than 200 nm by forming the PNP transistor in the vertical form. The emitter carrier density is $2 \times 10^{19}$ atoms/cc, the base carrier density is $5 \times 10^{16}$ atoms/cc, and the current gain $h_{FE}$ is over 100. Since the PNP transistor is formed from the same framework as the NPN transistor, parasitic capacitance is reduced substantially. Furthermore, the formed transistors have good withstand voltage characteristics resulting from their configuration profiles, and a small base-emitter voltage $V_{be}$ resulting from the large area of their emitters.

With this embodiment, the ultra high-speed NPN transistor and the high-speed PNP transistor can be formed on the same chip. Although the PNP transistor is slow compared with the NPN transistor, it is as minute as the NPN transistor since it is formed in the vertical form, so its performance is enough for use in a power supply circuit.

As described above, with the first semiconductor device according to the invention, an ultra high-speed D/A converter can be obtained by use of the ultra high-speed NPN transistor, and a high-speed and low-power-consumption LSI can be obtained by combining the NPN transistor with the high-speed PNP transistor.

Figure 2:
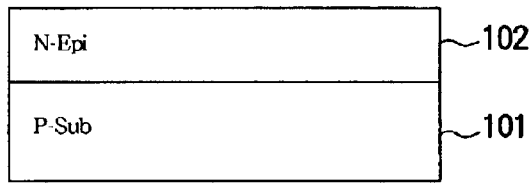
FIG. 2 is a diagram explaining a first method of manufacturing a semiconductor device according to the invention.
Figure 2:
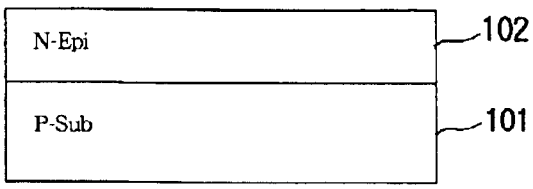
Figure 2:
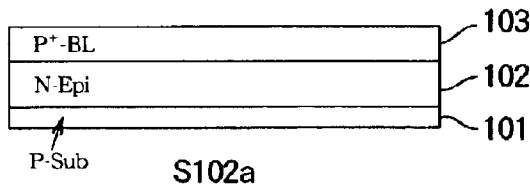
Figure 2:
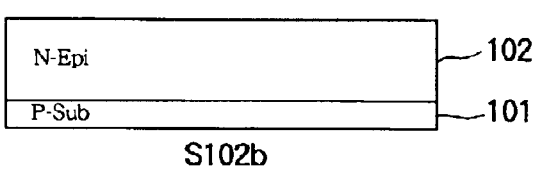
Figure 2:
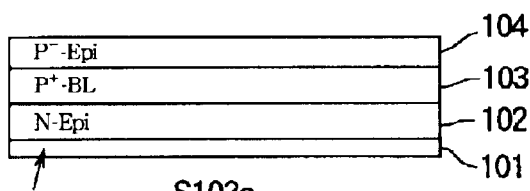
Figure 2:
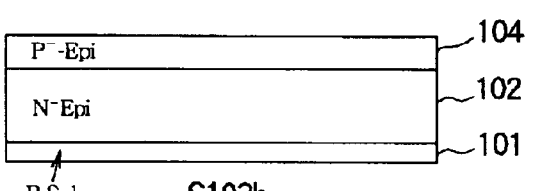
Figure 2:
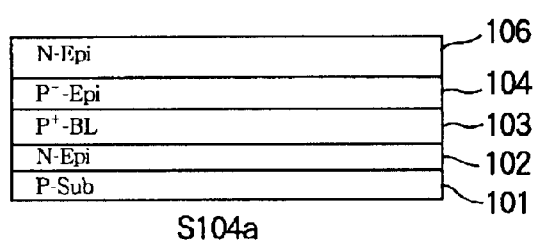
Figure 2:
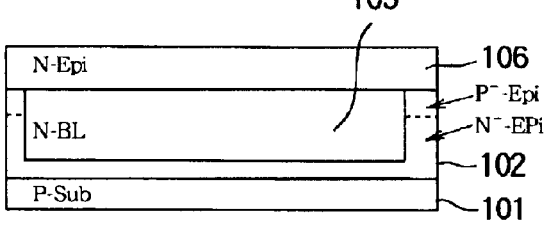
Figure 2:
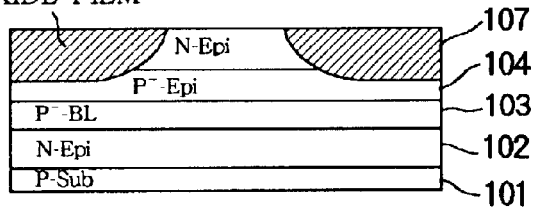
Figure 2:
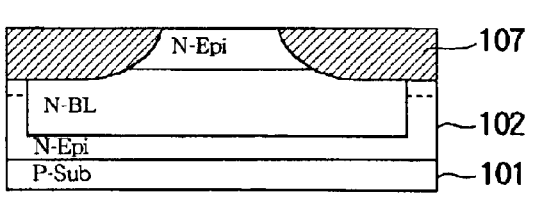
Figure 2:
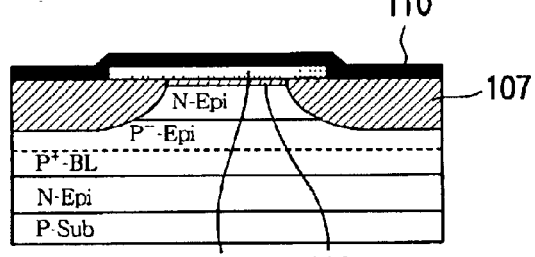
Figure 2:
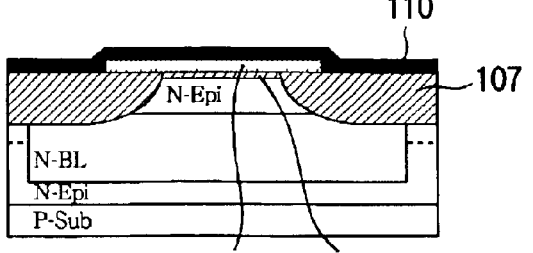
Figure 3:
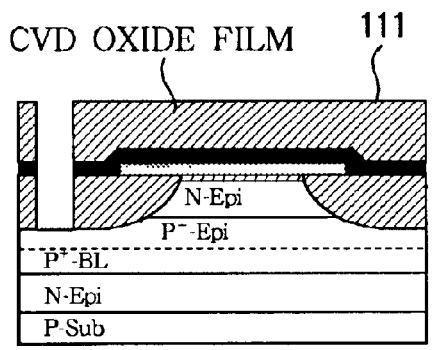
FIG. 3 is a diagram explaining the first method of manufacturing the semiconductor device according to the invention.
Figure 3:
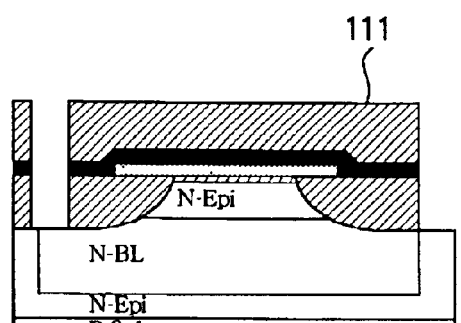
Figure 3:
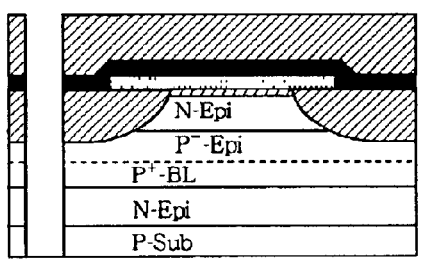
Figure 3:
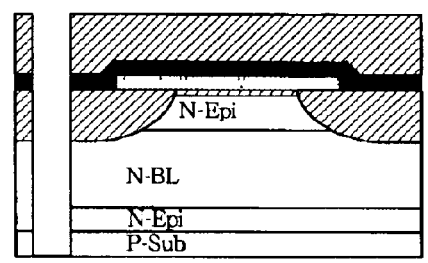
Figure 3:
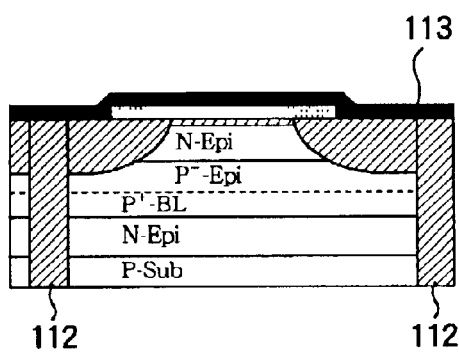
Figure 3:
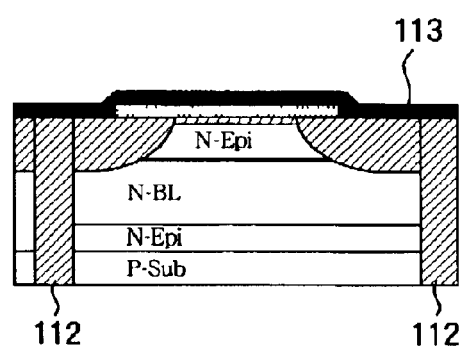
Figure 3:
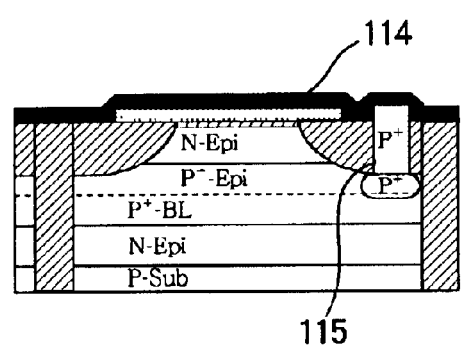
Figure 3:
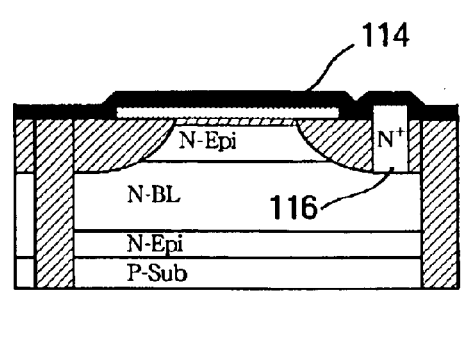

Next, a first method of manufacturing the semiconductor device according to the invention is explained with reference to FIGS. 2 to 4. This first method is a method for manufacturing the semiconductor device shown in FIGS. 1A to 1D in which the ultra high-speed NPN transistor and the high-speed PNP transistor are formed on the same chip. Here, a high-resistance P-substrate 101 has a crystal face <100>.

An N-epitaxial layer 102 containing phosphorous by about $5 \times 10^{15}$ atoms/cc is grown to a thickness of 5.5 μm on the substrate 101 (S101a, S101b). Then, a P$^+$-BL layer 103 to serve as a buried diffusion zone of the PNP transistor is grown only within the PNP transistor section by a first exposure/diffusion process (S102a, S102b). Subsequently, an epitaxial layer 104 containing boron by about $1\times10^{16}$ atoms/cc is formed to a thickness of about 1.0 μm to cover the entire substrate surface (S103a, S103b).

After that, an N$^+$-BL layer 105 to serve as a buried diffusion zone of the NPN transistor is formed by a second exposure/diffusion process, and then an N-epitaxial layer 106 containing phosphorus by about $5\times10^{16}$ atoms/cc is formed to a thickness of about 0.6 μm to cover the entire substrate surface (S104a, S104b). Next, a field oxide film 107 is formed by a process including a LOCOS process and a third exposure process, and then the monocrystal silicon of the active region is exposed (S105a, S105b).

After that, the active region is heated to form a thermally-oxidized film 108, and then, a highly boron-doped polycrystal silicon layer 109 is grown to a thickness of 200 nm to cover the entire substrate surface. Subsequently, this polycrystal silicon layer 109 is patterned by a fourth exposure process, and then, a silicon nitride film 110 is formed to a thickness of 200 nm (S106a, S106b). Next, a CVD oxide film 111 is formed to a thickness of 500 nm to cover the entire substrate surface. Then the CVD oxide film 111 and the field oxide film are subjected to anisotropic etching to expose the silicon substrate below the field oxide film (S107a, S107b). Subsequently, a 7.5 μm-deep trench is formed by trench etch using the remaining CVD oxide film 111 as a mask (S108a, S108b).

After that, the exposed surface is oxidized to a depth of about 20 nm, and then, a TEOS film 112 is grown to a height of about 700 nm at low pressure to fill the trench. Then, the entire substrate surface is subjected to etchback that continues until an end point is detected when the silicon nitride film 110 is exposed. Subsequently, the remaining silicon nitride film 110 is removed completely by use of hot phosphoric acid, and then, another silicon nitride film 113 is formed to a thickness of 200 nm (S109a, S109b).

Next, a collector electrode extension is formed in a way similar to the above-described trench-forming way. In brief, a hole to contain the collector electrode extension is made by an oxide film mask forming process, a sixth exposure process and an anisotropic etch process, and then a polycrystal silicon film layer is formed to a thickness of 1 μm to cover the entire substrate surface after a resist used is removed. Subsequently, the polycrystal silicon film is subjected to etchback so that the hole is plugged with the remaining polycrystal silicon.

Next, the substrate is implanted with phosphorus ions by $2\times10^{16}$ atoms/cm$^2$ with the PNP transistor section being protected by a process including a seventh exposure process, and subsequently, implanted with boron ions by $2\times10^{16}$ atoms/cm$^2$ with the NPN transistor section being protected by a process including an eighth exposure process. After that, the oxide film mask and the silicon nitride film 113 are removed, and then another silicon nitride film 114 is formed to cover the entire substrate surface (S109a, S109b). As a result, a P$^+$-polycrystal silicon region 115 is formed as the collector electrode extension of the PNP transistor, and an N$^+$-polycrystal silicon region 116 is formed as the collector electrode extension of the NPN transistor (S110a, S110b).

The base electrode extension shown in FIG. 1C is also formed during the above-described collector electrode extension forming step though it is not illustrated in the drawing. In brief, by the above sixth exposure process and a subsequent etching process, a hole extending to the N-epitaxial layer is made, and then this hole is filled polycrystal silicon. Subsequently, by the above seventh exposure process and a subsequent ion implanting process, the base electrode extension is implanted with phosphorus as well.

Next, by a ninth exposure process and a subsequent etching process, a part of the silicon nitride film 114 and a part of the polycrystal silicon layer 109 situated at the center portion of the active region are removed to make an opening and thereby expose the thermally-oxidized film 108. After that, a silicon nitride film 117 is formed to a thickness of 150 nm to cover the entire substrate surface, and then it is subjected to anisotropic etch. As a result, the silicon nitride film remains on the sidewall of the opening (S111a, S111b). Next, the thermally-oxidized film 108 is etched with diluted HF at a part exposed through the opening, and subsequently etched laterally to a depth of about 250 nm (S112a, S112b).

After that, a selective epitaxial growth of silicon is carried out for both the NPN and PNP transistor sections. The selective epitaxial growth is carried out after the natural oxidation film is completely removed in an atmosphere of hydrogen at a temperature of about 900° C. on an LP(Low Pressure)-CVD basis by use of SiH$_2$Cl$_2$ as a Si source gas, GeH$_4$ as a Ge source gas, SiCH$_6$ as a carbon source gas, PH$_3$ as an N-doping gas, and hydrogen as a carrier gas. The pressure is set to 20 Torr, and HCl is added to obtain selectivity. An N-silicon film is grown epitaxially to a thickness of about 50 nm in such an atmosphere, and subsequently, an N-epitaxial film 118a of a uniform profile containing 25% Ge and 0.5% carbon is grown. Next, the temperature is ramped up to 750° C., and then a monocrystal silicon film 118b containing P-impurities by about $5\times10^{19}$ atoms/cc is grown to a thickness of 23 nm. After that, an annealing process is carried out (S113a, S113b).

Next, a resist pattern is formed by a tenth exposure process that is carried out with the remainder of the PNP transistor section apart from the polycrystal silicon base region and the NPN transistor section being protected. After that, boron ions are implanted into the PNP transistor section under the condition of 100 keV and $1\times10^{15}$ atoms/cm$^2$ to form an active emitter region 119 of the PNP transistor (S114a, S114b).

Next, the entire substrate surface is oxidized thermally to a depth of about 5 nm, and then, a CVD oxide film 120 and an N-polycrystal silicon film 121 are grown in succession. Through the thermal budget in this step, the boron is diffused from the monocrystal silicon film 118b to the surface of the SiGe:C layer 118a to form an initial active base region. Next, the polycrystal silicon film 121 is etched back such that it remains on a sidewall of the opening, and the CVD oxide film 120 is exposed at the bottom of the opening. After that, by an eleventh exposure process carried out with only the PNP transistor being protected, the exposed CVD oxide film of the NPN transistor and the thermally oxidized film beneath the CVD oxide film are removed to expose the epitaxial silicon layer (S115a, S115b).

Then an N$^+$-polycrystal silicon 122 layer is formed so as to cover the entire substrate surface. This polycrystal silicon layer 122 is removed except a portion to serve as emitter electrode of the NPN transistor by a twelfth exposure process. Finally, RTA (Rapid Thermal Annealing) process is carried out to complete the active base region by carrier redistribution and to form an emitter region 123 by carrier diffusion from the polycrystal silicon layer for the NPN transistor section (S116a, S116b). It is permissible to transpose the step of selective epitaxial growth and the step of ion implantation for forming the active emitter of the PNP transistor. In this case, ion implantation energy can be reduced.

With the first manufacturing method according to the invention, the ultra high-speed NPN transistors or the SiGe:C-HBTs and the high-speed vertical PNP transistors can be formed on the same chip through twelve exposure processes except for a later wiring step. The selective epitaxial growth of SiGe:C is carried out for each of the NPN transistor section and the PNP transistor section to form the base for the NPN transistor section and form a part of the emitter for the PNP transistor section. As described above, this manufacturing method enables forming the PNP transistor and the NPN transistor in one and the same chip not by different process steps but by the common process steps.

Furthermore, according to this method, no degradation of device performance occurs for adding the NPN transistor to a device including only the PNP transistor, since any extra thermal treatment is not required after the base is formed. Moreover, of the parameters of the PNP transistor, the cut-off frequency $f_T$ having a significant effect on the a.c characteristics and the current gain $h_{FE}$ having a significant effect on the d.c. characteristics can be controlled by the dope amount and energy in the ion implantation. In the conventional horizontal transistors, these parameters depend on their surface patterns to a large degree, whereas with the above described first manufacturing method according to the invention, they can be controlled by the processing conditions, so high-performance devices can be manufactured easily.

Figure 5A:
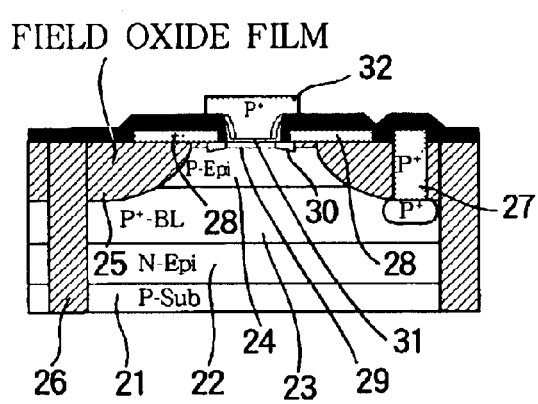
FIGS. 5A to 5F are diagrams showing a structure of a second semiconductor device according to the invention.
Figure 5B:
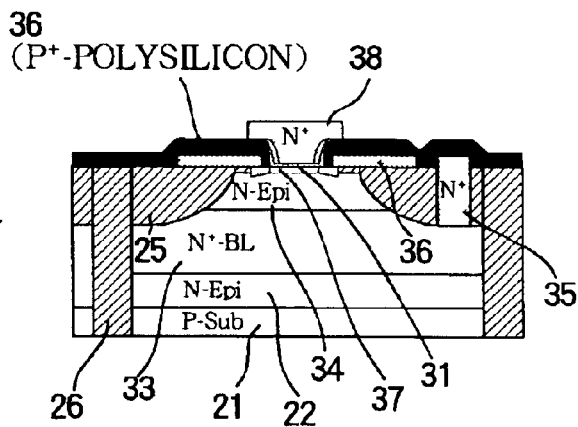
Figure 5C:
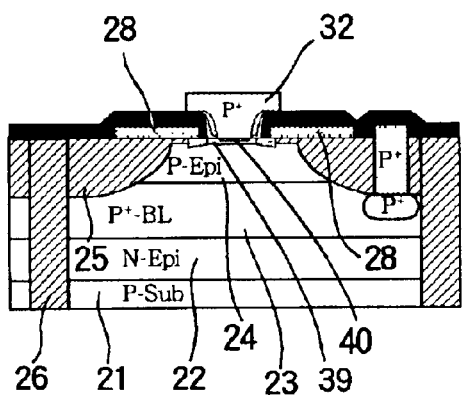
Figure 5D:
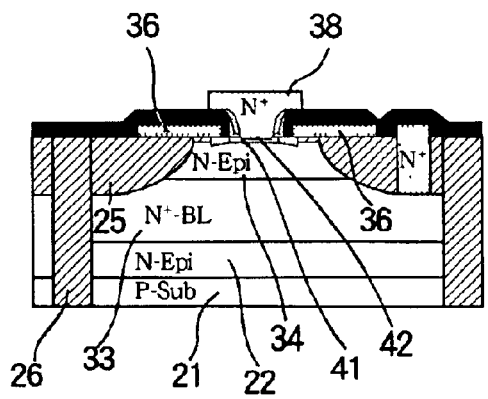

A second semiconductor device according to the invention is explained below with reference to FIGS. 5A to 5F. The second semiconductor device comprises MOS transistors (NMOS transistor, PMOS transistor) and bipolar transistors (PNP transistor, NPN transistor) formed on the same chip. FIG. 5A shows a cross section of an NMOS transistor, FIG. 5B shows a cross section of a PMOS transistor, FIG. 5C shows a cross section of a PNP transistor, and FIG. 5D shows a cross section of an NPN transistor.

In an NMOS transistor section and a PNP transistor section, an N-epitaxial layer 22, a P$^+$-layer 23, and a P-epitaxial layer 24 are formed on a P-substrate 21 in this order. In a PMOS transistor section and an NPN transistor section, the N-epitaxial layer 22, an N$^+$-layer 33, and an N-epitaxial layer 34 are formed on the P-substrate 21 in this order.

The bipolar transistors have a vertical structure by a self-aligned double-layered polycrystal silicon. A base 39 of the PNP transistor is formed from a SiGe layer. A base 41 of the NPN transistor is formed from a SiGe:C layer. The MOS transistors have a SiGe layer that is lattice-relaxed with the substrate beneath a channel. A monocrystal silicon layer 29 or 37 forming the channel that is not lattice-relaxed is on this SiGe layer. A source electrode and a drain electrode 28, 36 are formed in the same layer in which the base electrode of the bipolar transistor is formed. For the NPN transistor and the PMOS transistor, the doping type is P$^+$, and for the PNP transistor and the NMOS transistor, it is N$^+$. Furthermore, an emitter electrode of the bipolar transistor and a gate electrode 32 or 38 of the MOS transistor are formed form the same layer. For the PNP transistor and the NMOS transistor, the doping type is P$^+$, and for the NPN transistor and the PMOS transistor, it is N$^+$.

Figure 5E:
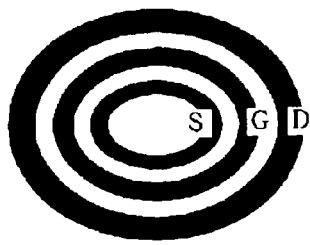
Figure 5F:
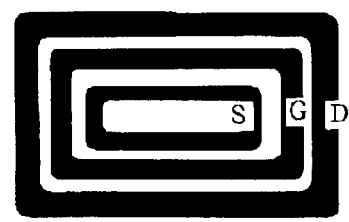

The MOS transistors have a closed endless structure. They have tubular electrodes with elliptic profiles as shown in FIG. 5E or rectangular profiles as shown in FIG. 5F, for example. Polysilicon electrodes 27, 35 are provided to enable controlling potentials of the portions below the channels of the MOS transistors individually. The transistors are separated from each other by a field oxide film 25 and a trench 26.

With the semiconductor device having the above-described configuration, a C-BiCMOS having small parasitic capacitance, small parasitic resistance, and small signal delay in its active region can be obtained. The bipolar transistors are HBTs. The NPN transistor is of the ultra-high speed type having the SiGe: C layer as its active base. The PNP transistor which is also an HBT having the SiGe base is of the high-speed type.

The MOS transistor has the SiGe layer that is lattice-relaxed with the substrate below its channel, so carrier mobility can be expected to increase since crystal structure of the silicon layer of the channel is deformed. Furthermore, by self-align reduction, the gate length of 0.1 $\mu$m or shorter can be realized even under the 0.35 $\mu$m-design rule. Furthermore, since the potentials of the portions below the channels of the MOS transistors can be controlled individually, they can be used as a VTMOS in which a threshold gate voltage is variable. For such reasons, according to the above-described embodiment of the invention, it is possible to design and manufacture a high-speed and high-integration LSI with low power-consumption and high driving-power.

Figure 6:
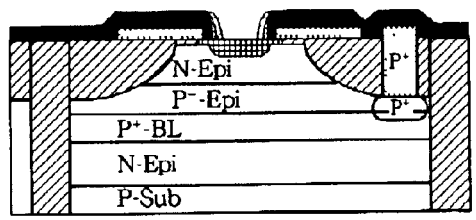
FIG. 6 is a diagram explaining a second method of manufacturing a semiconductor device according to the invention.
Figure 6:
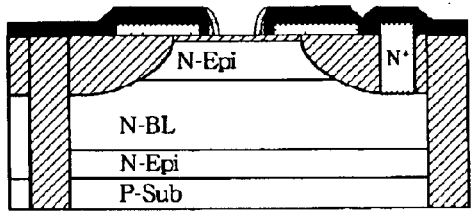
Figure 6:
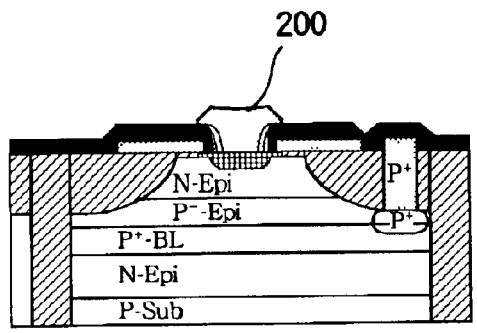
Figure 6:
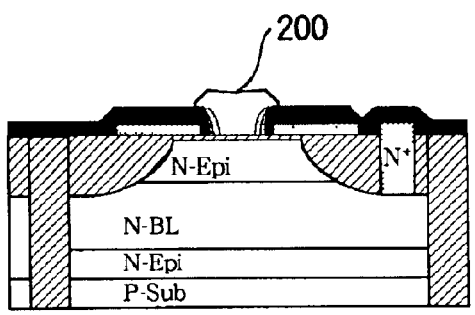
Figure 6:
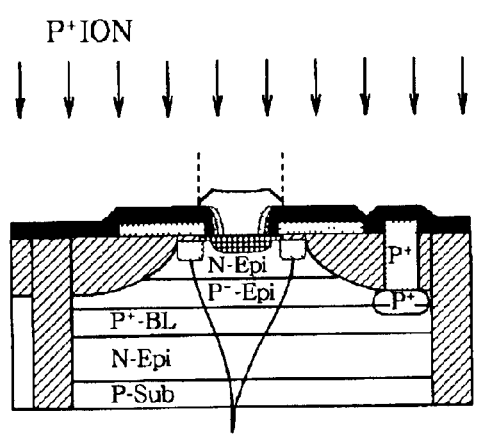
Figure 6:
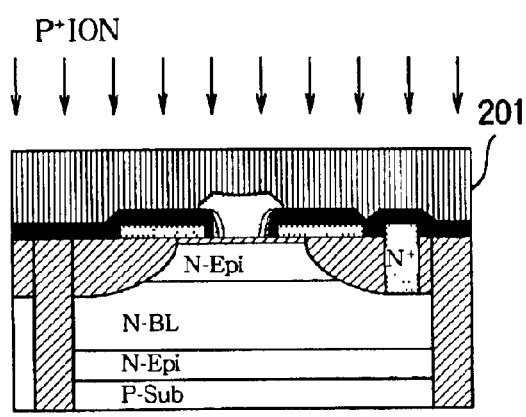

Next, a second method of manufacturing the semiconductor device according to the invention is explained. The second method is based on the foregoing first manufacturing method, and has the same steps as the first manufacturing method before the steps S115$a$, S115$b$ shown in FIG. 4. The structures that are the same as those obtained at steps S115$a$, S115$b$ in FIG. 4 are shown as structures obtained at steps S201$a$, S201$b$ in FIG. 6.

In this method, the next thing is to grow epitaxially an N$^+$-polycrystal silicon layer 200 (S202$a$, S202$b$). In the NPN transistor section, this polycrystal silicon layer 200 makes an emitter electrode. This polycrystal silicon layer 200 is not necessary to the PNP transistor, however, it is used as a mask in the following step, since it grows laterally in a self-aligning manner. Next, phosphorus ions are implanted into the substrate under the condition of 500 keV and $1\times10^{15}$ atoms/cm$^2$ with the NPN transistor being protected by a resist 201. As a result, a region 202 in which carrier density has been increased due to the mask effect of the polycrystal silicon layer 200 is formed in a portion connecting the active base with the base electrode in the PNP transistor section (S203$a$, S203$b$). After removing the resist 201, an RTA process is carried out to form an intrinsic emitter.

Although the N$^+$-polycrystal silicon layer 200 is formed by selective growth in this second manufacturing method, it can be formed by overall growth of an N$^+$-polycrystal silicon layer and a subsequent patterning through exposure and etch as in the case of the first manufacturing method. However, parasitic resistance may increase slightly since radiation error of a photolithographic apparatus used is not negligible in this case.

According to the second manufacturing method, it is possible to make impurity concentration in the link portion connecting the intrinsic base to the polycrystal base electrode within the PNP transistor section equal to that in the intrinsic base ($5\times10^{16}$ atoms/cc). This region of the PNP transistor is formed by epitaxial growth along with the intrinsic collector of the NPN transistor, so if ion implantation is carried out in a straightforward manner, the current gain $h_{FE}$ lowers for the PNP transistor and the parasitic collector-base capacitance $C_{tc}$ increases for the NPN transistor. Accordingly, in the second manufacturing method, the impurity concentration is increased only in the above-described link portion by using the polycrystal silicon layer that has grown in a self-aligning manner as a mask even though the number of exposure processes increases by one. As a result, the total base resistance of the PNP transistor is reduced. If ion implantation is carried out not in a self-aligning manner, the effect of reduction of the base resistance falls in some degree due to misalignment.

Figure 7:
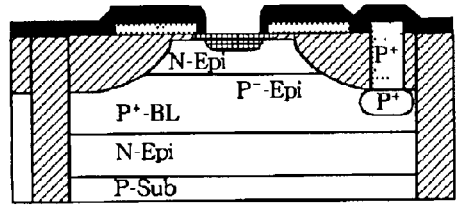
FIG. 7 is a diagram explaining a third method of manufacturing a semiconductor device according to the invention.
Figure 7:
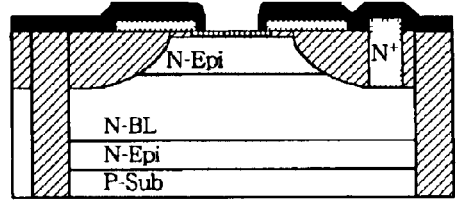
Figure 7:
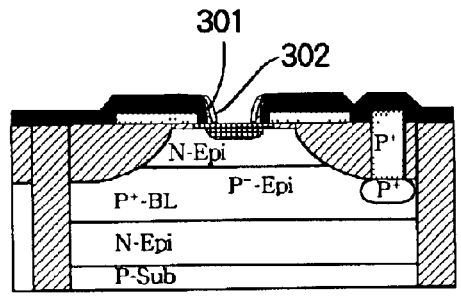
Figure 7:
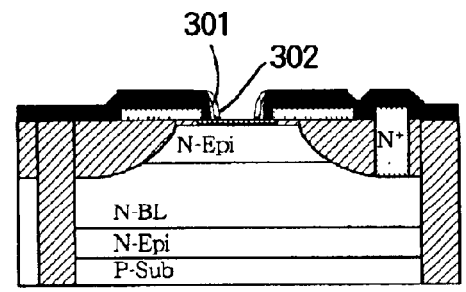
Figure 7:
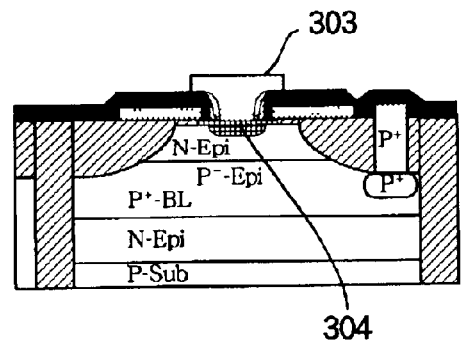
Figure 7:
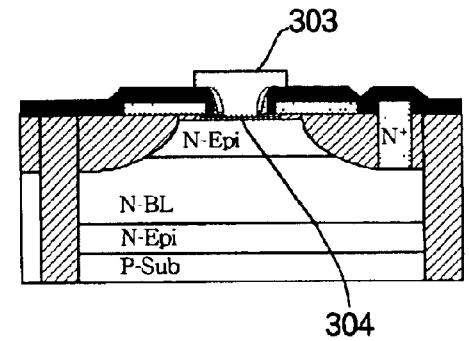
Figure 7:
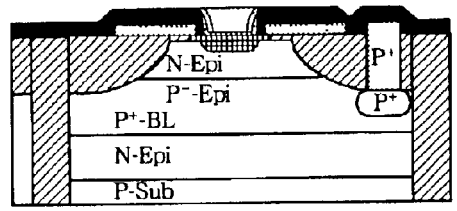

Next, a third method of manufacturing a semiconductor device according to the invention is explained with reference to FIG. 7. The third manufacturing method is based on the foregoing first manufacturing method as well, however, it is a method that enables forming a PNPN thyristor in addition to the NPN transistor and the PNP transistor in one chip.

Figure 4:
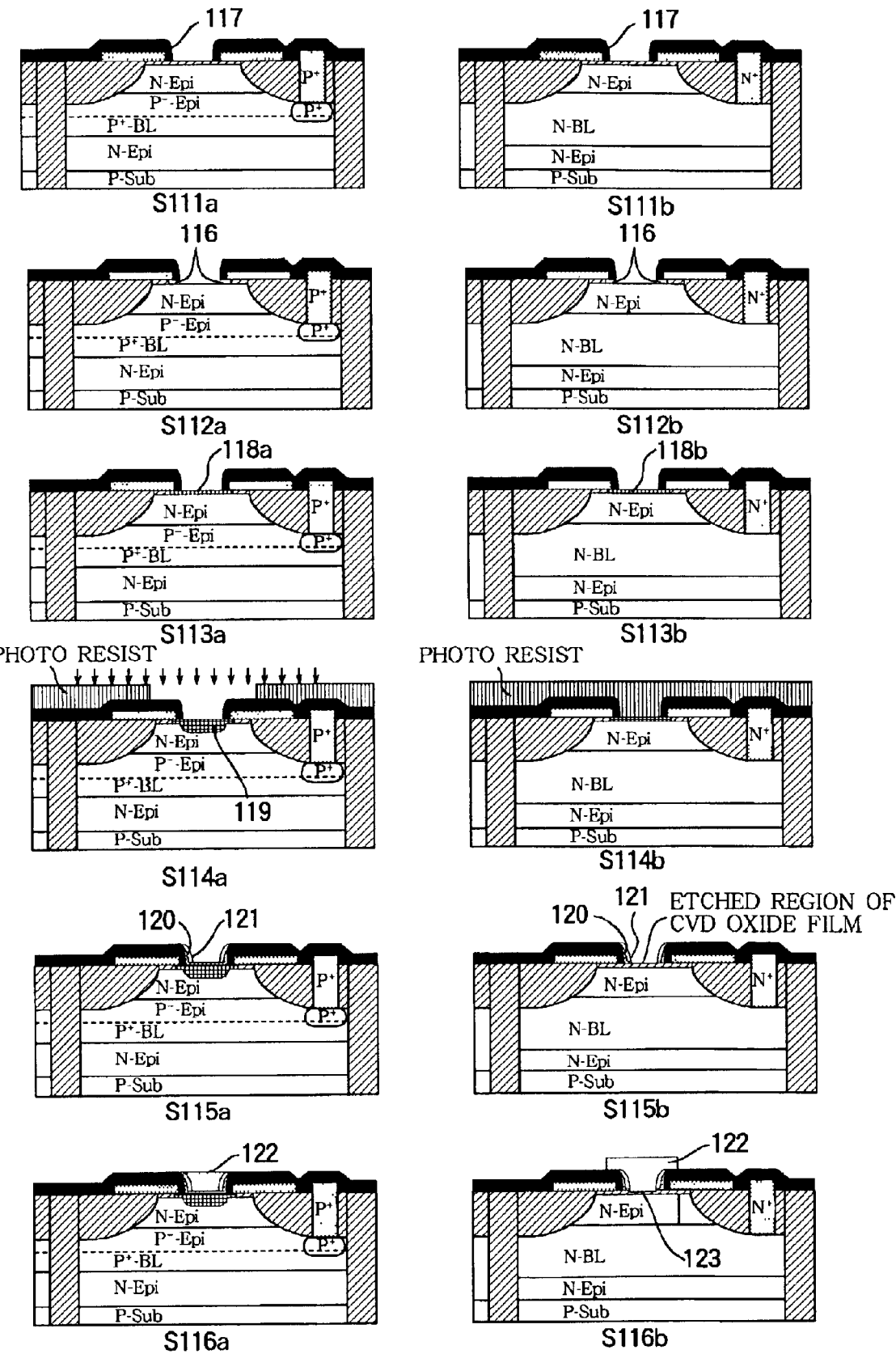
FIG. 4 is a diagram explaining the first method of manufacturing the semiconductor device according to the invention.

The second method has the same steps as the first manufacturing method before the steps S114a, S114b shown in FIG. 4. The structures that are the same as those obtained at the steps S114a, S114b in FIG. 4 are shown as structures obtained at steps S301a, 301b in FIG. 7. The steps after S301a, 301b shown in FIG. 7 are for forming the PNPN thyristor and the NPN transistor. The steps for forming the PNP transistor are the same as those of the first manufacturing method.

After completion of the steps S301a, S301b, the exposed silicon surface is oxidized to a depth of 5 nm as in the case of the first manufacturing method. Then a 50 nm-thick CVD oxide film 301 and a 200 nm-thick polycrystal silicon film 302 are formed in succession. Next, the polycrystal silicon film 302 is etched back anisotropically such that it remains on a sidewall of the opening. Subsequently, a resist pattern for protecting only the PNP transistor section is formed, and then the CVD oxide film 301 and the 5 nm-thick thermally oxidized film are etched (S302a, S302b).

Next, after the resist pattern is removed, a 200 nm-thick N$^+$-polycrystal silicon film 303 is formed to cover the entire substrate surface, and subsequently an RTA process is carried out to form an active N$^+$-diffusion region 304 by impurity diffusion from this polycrystal silicon film 303 (S303a, S303b, S303c). Through the above steps, the NPN transistor, the PNP transistor, and the PNPN thyristor are formed. They all have a vertical structure.

The third manufacturing method described above has the advantage that the PNPN thyristor can be formed without carrying out any extra steps. Furthermore, since the PNPN thyristor is formed in the vertical structure as well as the NPN transistor and the PNP transistor, the third method is advantageous to manufacturing a device including negative-resistance elements.

Figure 8:
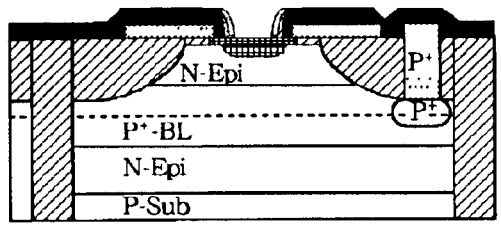
FIG. 8 is a diagram explaining a fourth method of manufacturing a semiconductor device according to the invention.
Figure 8:
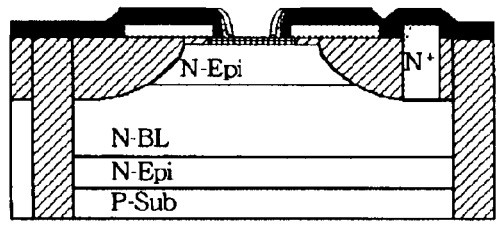
Figure 8:
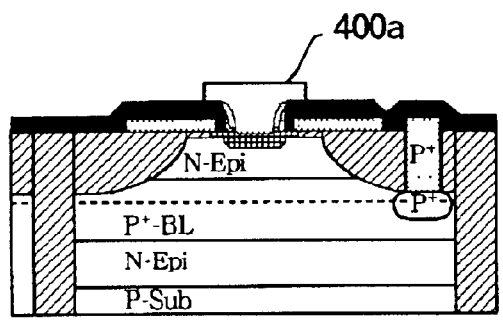
Figure 8:
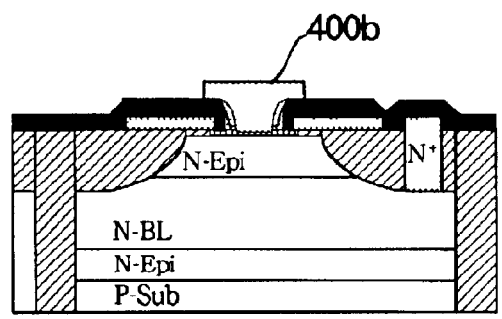

Next, a fourth method of manufacturing a semiconductor device according to the invention is explained with reference to FIG. 8. The fourth method is based on the foregoing first manufacturing method as well, and has the same steps as the first manufacturing method before the steps S115a, S115b shown in FIG. 4. The structures obtained at the steps S115a, S115b in FIG. 4 are shown as structures obtained at steps S401a, S401b in FIG. 8.

In the fourth method, for not only the NPN transistor section but for the PNP transistor section, the exposed CVD oxide film and the very thin thermally-oxidized film are etched to form a non-doped polycrystal silicon film having a thickness of about 200 nm. Then this polycrystal silicon film is selectively doped with boron by about $2 \times 10^{20}$ atoms (see 400a in FIG. 8) for the PNP transistor section, and is selectively doped with phosphorus by about $3 \times 10^{20}$ atoms fro the NPN transistor portion (see 400b in FIG. 8). Subsequently, electrode patterning is carried out. After that, an RTA process is carried out to form an intrinsic emitter region of the NPN transistor (S402a, S402b). In the PNP transistor section, its intrinsic emitter region has been already formed.

The PNP transistor formed by the fourth manufacturing method described above has an emitter resistance smaller than that of the PNP transistor formed by the first manufacturing method. However, since the number of exposure processes increases, and in-situ doping cannot be carried out, annealing to the polycrystal silicon films 400a and 400b may be required.

Next, a fifth method of manufacturing a semiconductor device according to the invention is explained with reference to FIGS. 9 and 10. The fifth method enables forming a still higher PNP transistor and NPN transistor in one chip. Here, a high-resistance P-substrate 501 has a crystal orientation <100> (S501a, S501b).

An N-epitaxial film 502 containing phosphorous by about $5 \times 10^{15}$ atoms/cc is grown to a thickness of 5.5 $\mu$m, and subsequently, a region to serve as a buried diffusion layer is formed by two exposure processes and impurity diffusion technology. As a result, an N$^+$-BL layer 504 is formed for the NPN transistor section and a P$^+$-BL layer 503 is formed for the PNP transistor section (S502a, S502b). Next, an epitaxial film is grown at normal atmospheric pressure to cover the entire substrate surface. This film is formed to a thickness of about 0.7 $\mu$m without letting any doping gas flow. As a result, a P-epitaxial layer 505a grows on the P$^+$-BL layer 503, and an N-epitaxial layer 505b grows on the N$^+$-BL layer 504 (S503a, S503b). It is a consequence of the auto-doping effect in the epitaxial layers in the course of growing, or the phenomenon in which impurity atoms vaporized from the substrate surface collide with the gas in the atmosphere to scatter and burrow into the films. So it is advantageous for the vaporized atoms to have a short mean free path.

Next, a field oxide film 506 is formed by LOCOS technology through a third exposure process. Thus an active regions is defined. Then after removal of the oxide film on the active region (S504a, S504b), the active region is thermally oxidized (see 507 in FIG. 9). Subsequently, a polycrystal silicon layer 508 is formed to cover the entire substrate surface. After that, the polycrystal silicon layer 508 is etched to make a base electrode extension by a fourth exposure process and etching technology, and subsequently, a silicon nitride film 509 is formed to cover the entire substrate surface (S505a, S505b).

Next, a trench 520 filled with an oxide film is formed by a step including a fifth exposure process as in the case of the first manufacturing method, and a collector electrode portion is plugged with polycrystal silicon by a series of steps including a sixth exposure process. Subsequently, the oxide film formed on the surface as a mask and the silicon nitride film are all removed in succession. Next, a base electrode 508a of the PNP transistor and a collector electrode 512 of the NPN transistor are caused to be of N$^+$-type by a sixth and seventh exposure processes and a subsequent phosphorus ion implanting process. Then boron ions are implanted to cause a collector electrode 511 of the PNP transistor and a base electrode 508b of the NPN transistor to be of P$^+$ type. By a subsequent annealing process, impurities are diffused from the collector plug to a portion for connection with the substrate. Then a silicon nitride film 510 is formed to cover the entire substrate surface (S506a, S506b).

Next, the silicon nitride film 510 and the polycrystal silicon layer 508 are etched with a width of 0.5 $\mu$m through an eighth exposure process, and then a silicon nitride film is formed to a thickness of 1000 Å to cover the entire substrate surface. After that, this silicon nitride film is etched back such that it remains as a sidewall 513 of the etched region (S507a, S507b). Next, the exposed thermally-oxidized film 507 of the PNP transistor section is etched by diluted HF with the NPN transistor section being protected by a resist pattern formed through a ninth exposure process. Subsequently, side etch is carried out to a depth of about 250 nm to expose in part the bottom of the polycrystal silicon layer 508. Subsequently, a selective epitaxial film 514 is grown after removal of the resist pattern (S508a, S508b). This film 514 comprises the following layers.

(1) A 50 nm-thick P-silicon layer having impurity concentration of $5\times10^{16}$ atoms/cc.
(2) A 30 nm-thick P—SiGe layer having impurity concentration of $5\times10^{16}$ atoms/cc.
(3) A 10 nm-thick N—SiGe layer having impurity concentration of $5\times10^{19}$ atoms/cc.
(4) A 20 nm-thick N—SiGe layer.
(5) A 25 nm-thick N-silicon layer.

The epitaxial growth conditions are similar to those in the first manufacturing method, however, carbon is not included and conductivity types of the layers are replaced between P and N. The base is initially as thick as the SiGe layer which is 10 nm thick, however, it expands eventually to about 40 nm by thermal diffusion. Next, the exposed silicon surface of the PNP transistor section is thermally oxidized (see 515 in FIG. 10) to a depth of 5 nm (S509a, S509b). After that, the exposed thermally-oxidized film 507 of the NPN transistor section is etched by diluted HF with the PNP transistor section being protected by a resist pattern formed through a tenth exposure process. Subsequently, side etch is carried out to a depth of about 250 nm to expose in part the bottom of the polycrystal silicon 508 (S510a, S510b). Next, a selective epitaxial film 518 is grown within this etched portion as in the case of the first manufacturing method to form an intrinsic base of the PNP transistor (S511a, S511b).

The fifth manufacturing method is characterized by forming the bases of the PNP transistor and the NPN transistor by two selective epitaxial growth processes carried out in succession thereby letting the PNP and NPN transistors be HBTs. The surface of the epitaxial film grown by the first epitaxial growth is thermally oxidized to a depth of about 5 nm, so the second selective epitaxial growth does not undergo any adverse effect.

Next, the oxide film on the surface of the selective epitaxial film of the PNP transistor section is removed by diluted HF, and then the surface is thermally oxidized to a depth of about 5 nm. Subsequently, formation of a CVD oxide film and formation of a polycrystal silicon film are carried out in succession. After that, these films are etched in succession to expose the surfaces of the selective epitaxial films, and then non-doped polycrystal silicon films 516 are grown thereon. Next, boron atoms are implanted into the polycrystal silicon film 516 of the PNP transistor section as impurities by about $1\times10^{21}$ atoms/cm$^2$ so that the film 516 becomes a P$^+$-film 516a. On the other hand, phosphorus or arsenic atoms are implanted into the polycrystal silicon film 516 of the NPN transistor section as impurities by about the same concentration so that the film 516 becomes an N$^+$-film 516b. After that, annealing process is carried out at a temperature of about 750° C., and then emitter electrodes of the transistors are formed by a thirteenth exposure process and an etching process. Finally, intrinsic emitter regions 517a, 517b are formed by impurity diffusion from the polycrystal silicon films 516a, 516b by RTA process (S512a, S512b). Although the selective epitaxial growth is carried out for the PNP transistor section first, it is permissible to carry out the selective epitaxial growth for the NPN transistor section first.

With the fifth manufacturing method, both the PNP and NPN transistors of the vertical type can be formed through thirteen exposure processes. Furthermore, since the PNP transistor is formed as a vertical HBT as well unlike the first manufacturing method, a PNP transistor having a cut-off frequency higher than 50 GHz can be obtained. By constituting a complementary circuit with the NPN transistor which is an HBT of the vertical type and the PNP transistor which is an HBT of the vertical type as well, it is possible to provide a bipolar device having less electric power consumption and higher driving power as well as higher operation speed.

As described above, the most significant feature of the fifth manufacturing method is in carrying out the selective epitaxial growth in two stages exploiting the property of selective epitaxial growth technology. Since the second selective epitaxial growth is carried out after the surface of the epitaxial film formed by the first selective epitaxial growth is oxidized very thin, the second epitaxial film is not affected by the presence of the first epitaxial film. Furthermore, profile redistribution due to thermal budget can be reduced to a minimum by using RTO technology and by carrying out the second epitaxial growth within a short time at a temperature below 800° C.

Figure 10:
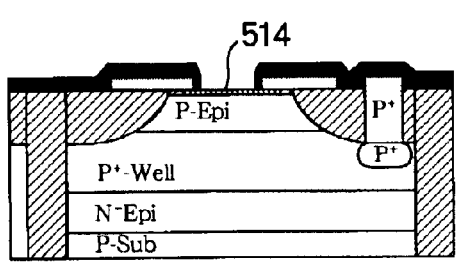
FIG. 10 is a diagram explaining the fifth method of manufacturing the semiconductor device according to the invention.
Figure 10:
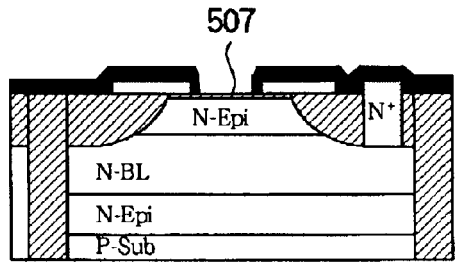
Figure 10:
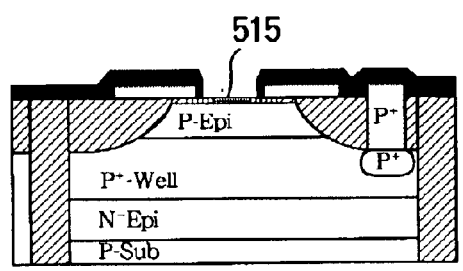
Figure 10:
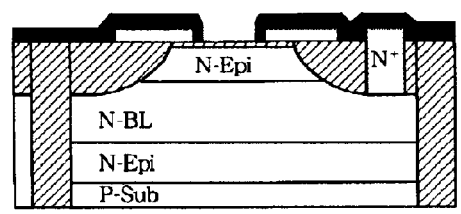
Figure 10:
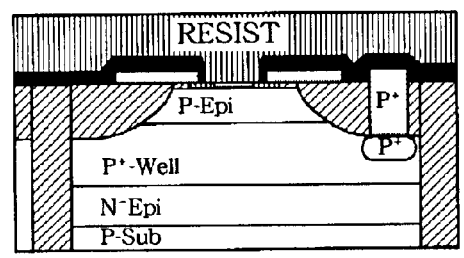
Figure 10:
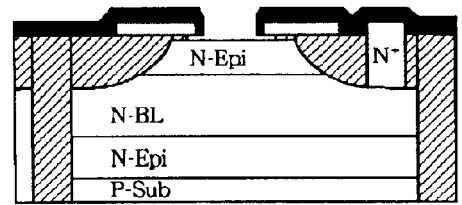
Figure 10:
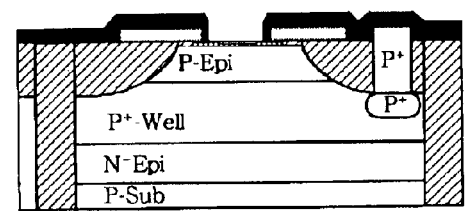
Figure 10:
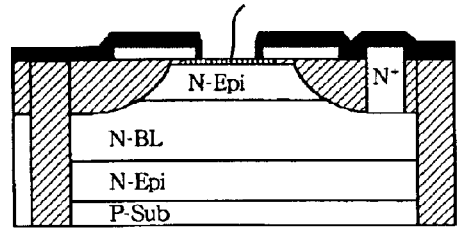
Figure 10:
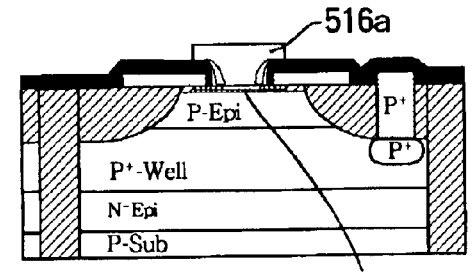
Figure 10:
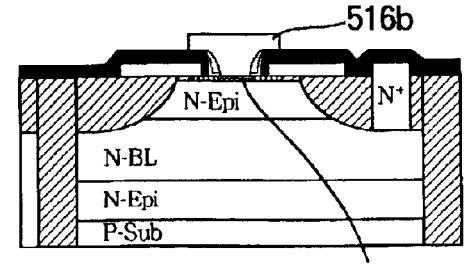
Figure 11:
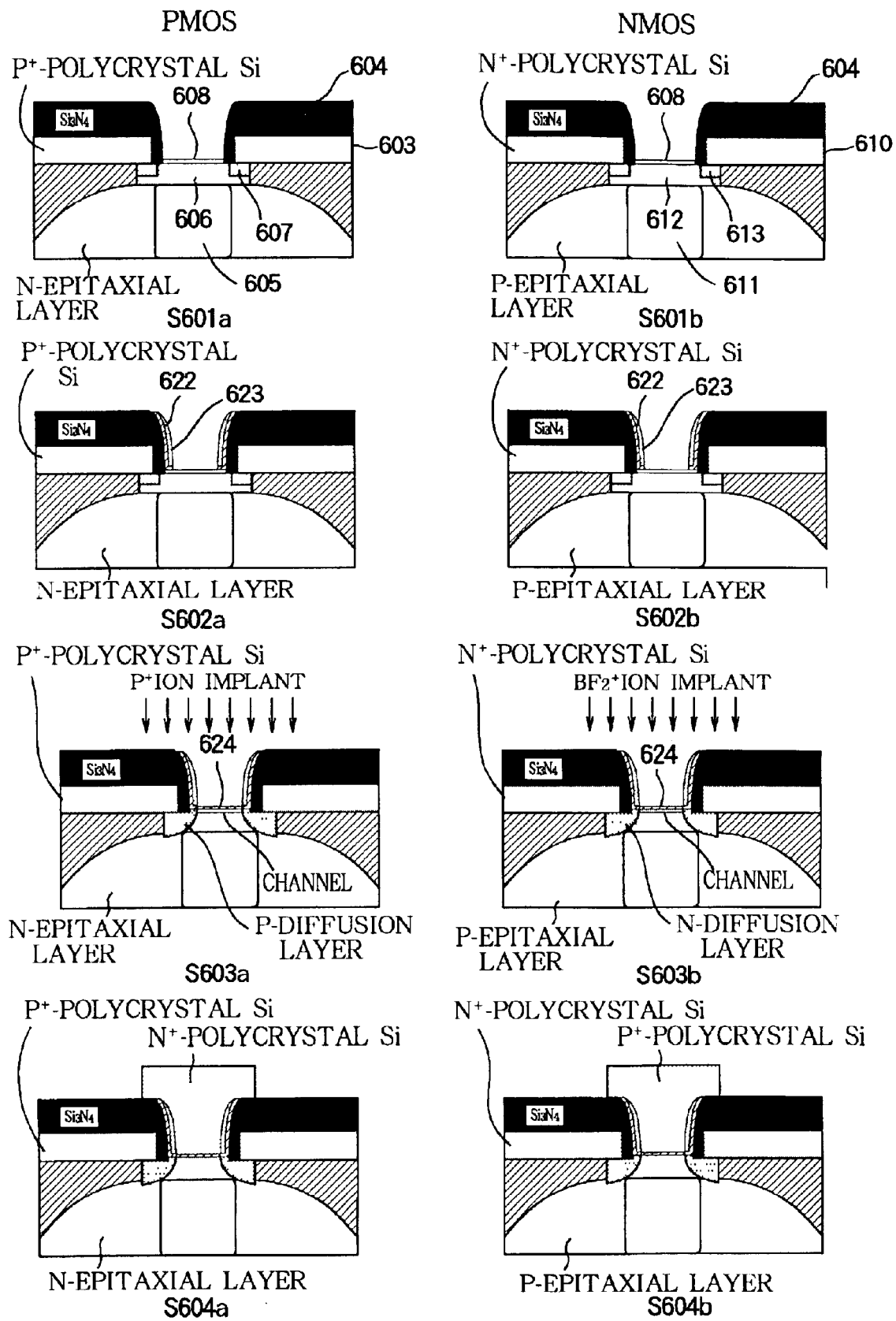
FIG. 11 is a diagram explaining a sixth method of manufacturing a semiconductor device according to the invention.
Figure 12:
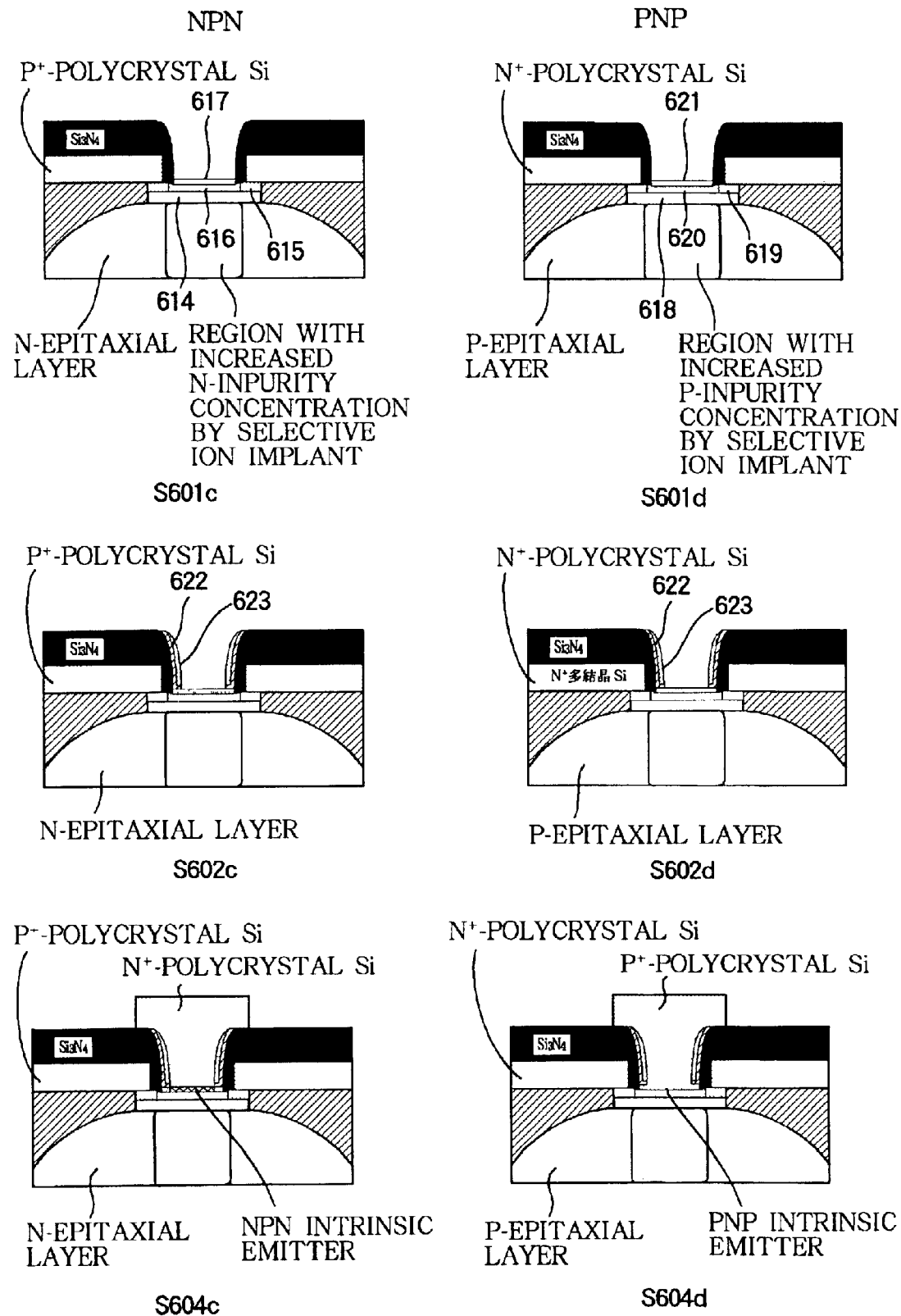
FIG. 12 is a diagram explaining the sixth method of manufacturing the semiconductor device according to the invention.

Next, a sixth method of manufacturing a semiconductor device according to the invention is explained with reference to FIGS. 11 and 12. The sixth method is a method of forming the second semiconductor device of the invention previously described, that is, a method of forming four different types of transistors (PNP, NPN, PMOS, NMOS) in one chip. The sixth manufacturing method share many steps with the fifth manufacturing method, so it is explained also with reference to FIGS. 9 and 10.

Figure 9:
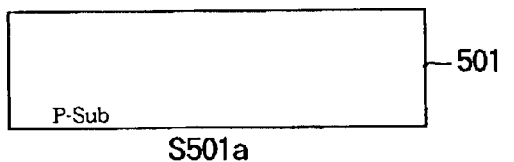
FIG. 9 is a diagram explaining a fifth method of manufacturing a semiconductor device according to the invention.
Figure 9:
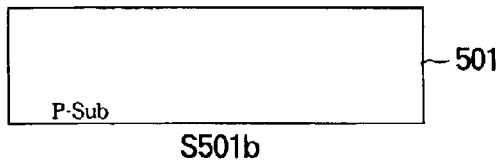
Figure 9:
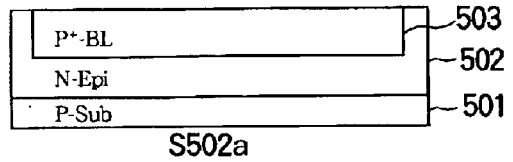
Figure 9:
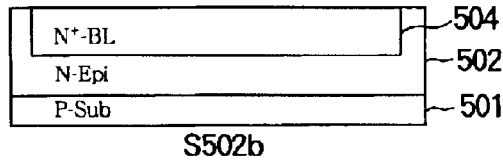
Figure 9:
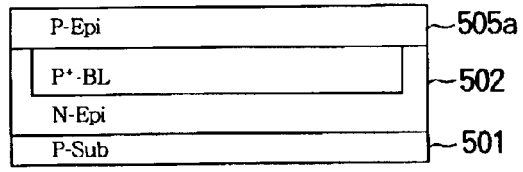
Figure 9:
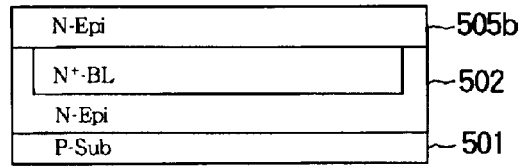
Figure 9:
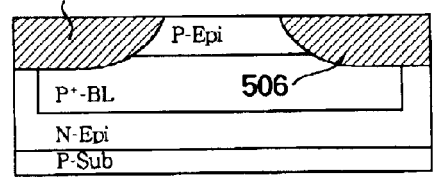
Figure 9:
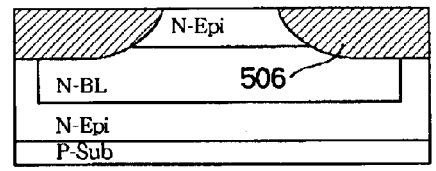
Figure 9:
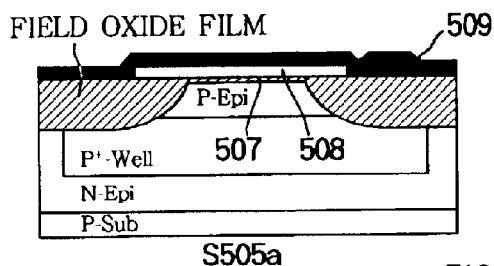
Figure 9:
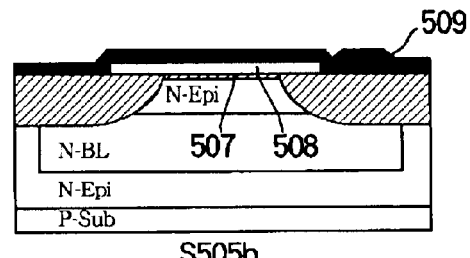
Figure 9:
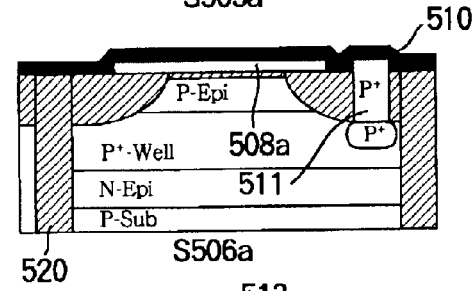
Figure 9:
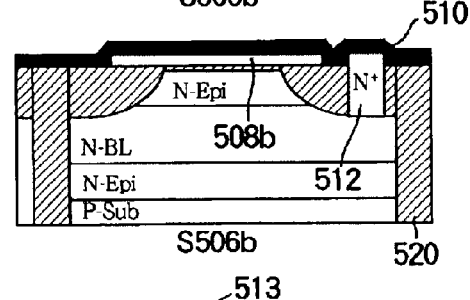
Figure 9:
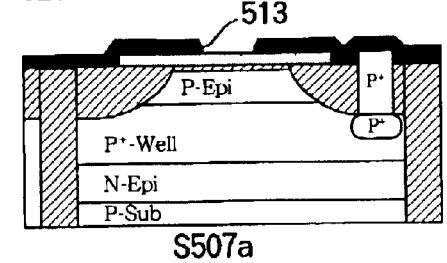
Figure 9:
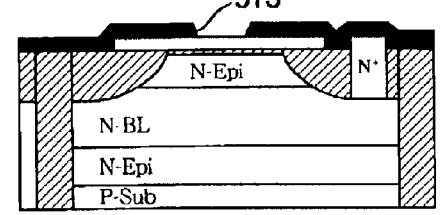

The six manufacturing method is the same as the fifth manufacturing method before the steps S507a, S507b in FIG. 9. In the sixth manufacturing method, after these steps, phosphorus-ion implantation is carried out with the PNP transistor section and the NMOS transistor section being protected by a resist pattern formed by a ninth exposure process in order to form an intrinsic collector region for the NPN transistor section and a region 605 containing a high concentration of phosphorus directly below the channel for the PMOS transistor section. Similarly, boron-ion implantation is carried out with the NPN transistor section and the PMOS transistor section being protected by a resist pattern formed by a tenth exposure process in order to form an intrinsic collector region for the PNP transistor section and a region 611 containing a high concentration of boron directly below the channel for the NMOS transistor section.

Next, the exposed thermally-oxidized film (equivalent to 507 in FIG. 9) is removed with the PNP transistor section and the NPN transistor section being protected by a resist pattern formed by an eleventh exposure process. Then after completion of a side etch to a depth of about 250 nm and a removal of the resist pattern, selective epitaxial growth is carried out. The grown epitaxial film has a double-layer structure. A first layer is a 100 nm-thick SiGe epitaxial layer containing 40% Ge (an N—SiGe layer 606 or a P—SiGe layer 612). A second layer is a 25 nm-thick silicon epitaxial layer containing no Ge (a polycrystal silicon layer 607 or 613). During the epitaxial growth of the first layer, stress relaxation occurs at an interface between the crystal face of the substrate and the SiGe epitaxial layer. However, since the second layer is as thin as 25 nm, stress relaxation doe not occur at an interface during the epitaxial growth of the second layer although the first layer contains a high concentration of Ge.

Accordingly, the epitaxial SiGe layer has an equant crystal structure, whereas the epitaxial silicon layer has a dimetric crystal structure undergoing stress. Since ions are implanted to the transistor sections to increase impurity concentrations of their surfaces before carrying out the epitaxial growth, the entire epitaxial film becomes N type for the PMOS transistor section, whereas it becomes P type for the NMOS transistor section due to the auto-doping effect. The structures obtained by the above processes are shown in a magnified form at steps S601a, S601b.

Next, the surface of the silicon layer 608 of each of the MOS transistor sections is thermally oxidized to a depth of about 5 nm. Then the exposed thermally-oxidized film 507 of the PNP transistor section is removed by diluted HF and subsequently etched laterally to a depth of about 250 nm with the PMOS and NMOS transistors and the NPN transistor being protected by a resist pattern formed by a twelfth exposure process. In this state, a selective epitaxial growth is carried out for the PNP transistor section to form an intrinsic base region as in the case of the fifth manufacturing method.

This region has a triple-layer structure. A first layer is a bottom silicon layer 618, a second layer is a SiGe layer 620, and a third layer is a cap silicon layer 621. The SiGe layer 620, or the second layer includes an N-doped layer in the middle (S601d in FIG. 12).

Next, the exposed silicon surface is thermally oxidized to a depth of about 5 nm. Then the thermally-oxidized film 507 of the NPN transistor section is removed by diluted HF, and subsequently etched laterally to a depth of about 25 nm with the PMOS and NMOS transistors and the PNP transistor being protected through a thirteenth exposure process. In this state, a selective epitaxial growth is carried out for this NPN transistor section to form an intrinsic base region as in the case of the fifth manufacturing method (S601c). This region has a triple-layer structure. A first layer is a bottom silicon layer 614, a second layer is a SiGe:C layer 616, and a third layer is a cap silicon layer 617.

Next, the exposed silicon surface is thermally oxidized to a depth of about 5 nm. Then a CVD oxide film 622 is formed to a thickness of about 50 nm to cover the entire substrate surface, and subsequently, a polycrystal silicon film 623 is formed to a thickness of about 150 nm. This silicon film 623 is etched laterally so that it remain as sidewalls (S602a, S602b, S602c, S602d).

Next, the exposed oxide film is removed, and then a thermally-oxidized film 624 that makes gate oxide films of the MOS transistors are formed. After that, the PMOS transistor section is implanted with $P^+$-ions, and the NMOS transistor section is implanted with $BF_2^+$-ions through a fourteenth exposure process and a fifteenth exposure process (S603a, S603b).

Then the thermally-oxidized film on the surfaces of the PNP and NPN transistor sections is removed with the MOS transistors being protected through a sixteenth exposure process, and subsequently a polycrystal silicon film is formed to a thickness of 200 nm to cover the entire substrate surface. After that, through the fourteenth and fifteenth exposure processes and a subsequent ion implantation process, the polycrystal silicon film is doped to be of $P^+$-type in the NMOS transistor section and the PNP transistor section, on the other hand, it is doped to be of $N^+$-type in the PMOS transistor section and the NPN transistor section. Next, an annealing process is carried out at temperatures of 750° C.–800° C. C After that, the polycrystal silicon film is shaped into emitter electrodes for the bipolar transistors, and into gate electrodes for the MOS transistors through seventeenth exposure process. Subsequently, RTA process is carried out to form intrinsic emitters of the bipolar transistors (S604a, S604b, S604c, S604d).

With the sixth manufacturing method, the NMOS and PMOS transistors can be formed on the same chip in addition to the PNP and NPN bipolar transistors. The sixth manufacturing method is characterized by forming the MOS transistors and the bipolar transistors at once using common frameworks, instead of forming them separately. To be more specific, the NMOS transistor is formed on the framework having the same structure and conductivity type as those of the PNP transistor, and the PMOS transistor is formed on the framework having the same structure and conductivity type as those of the NPN transistor.

Although the MOS transistor is restricted to the ring-shaped structure as in the case of the second semiconductor device previously explained, it can be formed within a sufficiently small area by micromachining technology, and its operation speed is high enough since the channel is on the silicon film undergoing stress at the relaxed SiGe layer and accordingly the carrier mobility is high. Furthermore, by the self-align reduction, the gate length of 0.1 $\mu$m or shorter can be realized even under the 0.35 $\mu$m-design rule. Furthermore, since both of the PNP and NPN transistors have the SiGe (C) structure for their bases, ultra-high speed operation can be expected. In addition, the number of exposure processes to be carried out during manufacturing is as small as 17, and many of the steps are made common to the different types of transistors, the sixth manufacturing method is superior to conventional methods of forming a C-BiCMOS device. Furthermore, since the sixth manufacturing method needs almost no extra heat treatment after the base forming step or the channel forming step at which performance of each transistor is determined, performance degradation can be minimum for each active device. Moreover, since the steps that have decisive effects on the performance of the active devices are tunable on an individual basis, the sixth manufacturing method has the large advantage of easy performance-optimization and high degree of flexibility.

The above explained preferred embodiments are exemplary of the invention of the present application which is described solely by the claims appended below. It should be understood that modifications of the preferred embodiments may be made as would occur to one of skill in the art.

What is claimed is:

1. A method of manufacturing a semiconductor device in which a vertical NPN transistor and a vertical PNP transistor are formed on a same substrate comprising:

forming a first oxide film, a P-polycrystal silicon film, and a second oxide film in succession on an N-silicon epitaxial film formed on substrate;

making an opening in the first oxide film through which a surface of the N-silicon epitaxial film and a part of a bottom of the P-polycrystal silicon film are exposed by anisotropically etching the second oxide film and the P-polycrystal silicon film, and then isotropically etching the first oxide film that has been exposed;

plugging at least a part of the opening by growing a selective epitaxial layer including a P-monocrystal layer from the surface of the N-silicon epitaxial film, and growing a polycrystal layer from the part of the bottom of the P-polycrystal silicon film; and adjusting, within a PNP transistor section, position and impurity concentration of a P-N junction by implanting or diffusing P-impurities into the N-silicon epitaxial film in a self-aligning manner by use of the opening.

2. A method of manufacturing a semiconductor device according to claim 1, further comprising, after said adjusting, forming an active emitter of the NPN transistor by forming a third oxide film to cover an entire substrate surface, etching back the third oxide film with the PNP transistor section being protected by a resist pattern to make a second opening in a self-aligning manner through which a center portion of a surface of the selective epitaxial layer within the NPN transistor section is exposed, forming an N-polycrystal silicon layer within the second opening, and diffusing impurities from the formed N-polycrystal silicon layer into the selective epitaxial layer.

3. A method of manufacturing a semiconductor device according to claim 1, in which said plugging and said adjusting are transposed.

4. A method of manufacturing a semiconductor device according to claim 1, further comprising, after said adjusting:

forming an oxide film and a polycrystal silicon film in succession to cover an entire substrate surface, etching back the polycrystal silicon film so that the polycrystal silicon film remains as a sidewall, and removing the oxide film within the opening to expose a surface of the selective epitaxial layer, forming an emitter electrode of the NPN transistor and forming a plug of the PNP transistor in a self-aligning manner by selectively forming a polycrystal silicon layer within respective openings for each of the NPN transistor section and a PNP transistor section, and increasing impurity concentration of surroundings of a portion of the N-silicon epitaxial film to serve as an active base of the PNP transistor by implanting N-impurities into the N-silicon epitaxial film with the NPN transistor section being protected by a resist pattern.

5. A method of manufacturing a semiconductor device according to claim 1, further comprising, said adjusting, forming a third oxide film to cover an entire substrate surface, etching back the third oxide film to make an opening for each of the PNP transistor section and an NPN transistor section in a self-aligning manner through which a center portion of a surface of the selective epitaxial layer is exposed, and growing an N-polycrystal silicon layer within each of the openings, and forming an active emitter of the NPN transistor by diffusing N-impurities from the grown N-polycrystal silicon layer for the NPN transistor section, and converting the PNP transistor section into a PNPN thyristor section by diffusing N-impurities from the grown N-polycrystal silicon layer for the PNP transistor.

6. A method of manufacturing a semiconductor device according to claim 1, further comprising, said adjusting, forming a third oxide film to cover an entire substrate surface, etching back the third oxide film to make an opening for each of the transistor section and an NPN transistor section in a self-aligning manner through which a center portion of a surface of the selective epitaxial layer is exposed, growing a polycrystal silicon layer within each of the openings, and forming an emitter electrode of the NPN transistor by implanting N-impurities into the grown polycrystal silicon layer and an active emitter of the NPN transistor by diffusing the N-impurities from the grown polycrystal silicon layer for the NPN transistor section, and forming an emitter electrode of the PNP transistor by implanting P-impurities into the grown polycrystal silicon layer for the PNP transistor section.

7. A method of manufacturing a semiconductor device in which a vertical NPN transistor and a vertical PNP transistor are formed on a same substrate comprising:

forming a P-epitaxial layer or a P-well layer for a PNP transistor section and forming an N-epitaxial layer or an N-well layer for an NPN transistor section on the substrate;

forming a first insulation film and a first polycrystal silicon layer in succession on the substrate on which the epitaxial layers or the well layers have been formed, separating the first polycrystal silicon layer in the PNP and NPN transistor sections by an exposure process and an etching process, and converting conduction type of the first polycrystal silicon layer into P-type for the NPN transistor section and into N-type for the PNP transistor section;

forming a second insulation film to cover an entire substrate surface and subsequently making an opening penetrating through the second insulation film and the first polycrystal silicon layer to expose the first insulation film in each of the NPN and PNP transistor sections;

isotropically etching the exposed first insulation film and then etching laterally the exposed first insulation film in the PNP transistor section with the NPN transistor section being protected by a resist pattern to expose a surface of the P-epitaxial layer or the P-well layer and a part of a bottom of the first polycrystal silicon layer, subsequently growing a first selective epitaxial layer containing N-impurities within the opening in the PNP transistor section, and thermally oxidizing a surface of the grown first selective epitaxial layer; and isotropically etching the exposed first insulation film and then etching laterally the exposed first insulation film in the NPN transistor section with the PNP transistor section being protected by a resist pattern to expose a surface of the N-epitaxial layer or the N-well layer and a part of a bottom surface of the first polycrystal silicon layer, subsequently growing a second selective epitaxial layer containing P-impurities within the opening in the NPN transistor section, and thermally oxidizing a surface of the grown second selective epitaxial layer.

8. A method of manufacturing a semiconductor device according to claim 7, in which said etching in the PNP transistor section and the-fifth-step said etching in the NPN transistor section are transposed.

9. A method of manufacturing a semiconductor device according to claim 7, in which said etching in the NPN transistor section comprises growing the second selective epitaxial layer containing no impurities within the opening in the NPN transistor section, and subsequently diffusing P-impurities into the grown second selective epitaxial layer through a surface thereof.

10. A method of manufacturing a semiconductor device in which a vertical PNP transistor, a vertical NPN transistor, a lateral PMOS transistor and a lateral NMOS transistor are formed on a same substrate comprising:

forming a P-epitaxial layer for each of a PNP transistor section and an NMOS transistor section, and forming an N-epitaxial layer for each of an NPN transistor section and a PMOS transistor section on the substrate;

forming a first insulation film and a first polycrystal silicon layer in succession on the substrate on which the P-and N-epitaxial layers have been formed, separating the first polycrystal silicon layer in the NPN, PNP, PMOS, and NMOS transistor sections by an exposure process and an etching process, and converting conduction type of the first polycrystal silicon layer into P-type for the NPN and PMOS transistor sections and into N-type for the PNP and NMOS transistor sections;

forming a second insulation film to cover an entire substrate surface, and subsequently making an opening penetrating through the second insulation film and the first polycrystal silicon layer to expose the first insulation film in each of the NPN, PNP, PMOS and NMOS transistor sections;

isotropically etching the exposed first insulation film and then etching laterally the exposed first insulation film in each of the PMOS and NMOS transistor sections with the PNP and NPN transistor sections being protected by a resist pattern to expose surfaces of the P- or N-epitaxial layer layers and a part of a bottom of the first polycrystal silicon layer, subsequently growing an SiGe epitaxial layer that is lattice-relaxed with the P- or N-epitaxial layers and growing a silicon epitaxial layer that is not lattice-relaxed with the SiGe epitaxial layer within the openings, and then thermally oxidizing a surface of the grown silicon epitaxial layer;

isotropically etching the exposed first insulation film and then etching laterally the exposed first insulation film in the PNP transistor section with the NPN, PMOS and NMOS transistor sections being protected by a resist pattern to expose surfaces of the P-epitaxial layer and a part of a bottom of the first polycrystal silicon layer, subsequently growing a second selective epitaxial layer containing N-impurities within the opening in the PNP transistor section, and thermally oxidizing a surface of the grown second selective epitaxial layer;

isotropically etching the exposed first insulation film and then etching laterally the exposed first insulation film in the NPN transistor section with the PNP, PMOS and NMOS transistor sections being protected by a resist pattern to expose surfaces of the N-epitaxial layer and a part of a bottom of the first polycrystal silicon layer, subsequently growing a third selective epitaxial layer containing P-impurities within the opening in the NPN transistor section, and thermally oxidizing a surface of the grown third selective epitaxial layer;

forming a third insulation film and a second polycrystal silicon layer in succession to cover the entire substrate surface, subsequently etching back the second polycrystal silicon layer so that the second polycrystal silicon layer remains as a sidewall of each of the openings, etching the third insulation film and an insulation film having been formed within each of the openings by using the remaining second polycrystal silicon layer as a mask to expose a surface of the corresponding epitaxial layer within each of the openings, thermally oxidizing the exposed surface of the corresponding epitaxial layer thereby forming a gate oxide film for each of the PMOS and NMOS transistors, and implanting impurities into the PMOS and NMOS transistor sections for adjusting threshold voltages by use of a resist mask; and removing the insulation films having been formed within the openings of the NPN and PNP transistor sections by use of a resist pattern, forming a third polycrystal silicon layer within each of the NPN, PNP, PMOS, and NMOS transistor sections, and converting conduction type of the third polycrystal silicon layer into N-type for the NPN and PMOS transistor sections and into P-type for the PNP and NMOS transistor sections.

11. A method of manufacturing a semiconductor device according to claim 10, in which said etching in the PNP transistor section comprises growing the second selective epitaxial layer containing no impurities within the opening in the PNP transistor section, and diffusing P-impurities into the grown second selective epitaxial layer through the surface thereof.

* * * * *